(12) United States Patent
Choi et al.

(10) Patent No.: US 12,484,377 B2
(45) Date of Patent: Nov. 25, 2025

(54) DISPLAY APPARATUS INCLUDING PLURALITY OF INORGANIC INSULATING PATTERNS OVERLAPPING SUBPIXEL AREA AND ELECTRONIC APPARATUS INCLUDING THE SAME

(71) Applicant: Samsung Display Co., Ltd., Yongin-Si (KR)

(72) Inventors: Jonghyun Choi, Yongin-si (KR); Jinho Ju, Yongin-si (KR); Younjoon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 679 days.

(21) Appl. No.: 17/725,447

(22) Filed: Apr. 20, 2022

(65) Prior Publication Data

US 2022/0415987 A1 Dec. 29, 2022

(30) Foreign Application Priority Data

Jun. 24, 2021 (KR) .......................... 10-2021-0082334

(51) Int. Cl.
*H10K 59/121* (2023.01)
(52) U.S. Cl.
CPC ..... *H10K 59/1213* (2023.02); *H10K 59/1216* (2023.02)
(58) Field of Classification Search
CPC ........... H10K 59/1213; H10K 59/1216; H10K 59/131; H10K 59/124; H10K 50/844; H10K 59/123; H10K 50/8445
See application file for complete search history.

(56) References Cited

U.S. PATENT DOCUMENTS

| | | | | |
|---|---|---|---|---|
| 2012/0074388 | A1* | 3/2012 | Park | H10K 59/1216 438/23 |
| 2017/0069701 | A1* | 3/2017 | Cai | H10K 59/8731 |
| 2018/0308916 | A1 | 10/2018 | Kim et al. | |
| 2019/0278145 | A1 | 9/2019 | Tanaka et al. | |
| 2019/0288046 | A1* | 9/2019 | Park | H10K 59/124 |
| 2020/0303479 | A1* | 9/2020 | Kim | H10D 86/60 |
| 2021/0028272 | A1* | 1/2021 | Won | H10K 59/1315 |
| 2021/0074783 | A1 | 3/2021 | Kang et al. | |
| 2021/0257421 | A1 | 8/2021 | Liu et al. | |

FOREIGN PATENT DOCUMENTS

| | | |
|---|---|---|
| CN | 110112317 A | 8/2019 |
| CN | 111682028 A | 9/2020 |
| KR | 1020180119192 A | 11/2018 |
| KR | 10-2021-0008977 A | 1/2021 |
| KR | 1020210029339 A | 3/2021 |

* cited by examiner

*Primary Examiner* — Jacob Y Choi
*Assistant Examiner* — Grace Cha
(74) *Attorney, Agent, or Firm* — Innovation Counsel LLP

(57) ABSTRACT

A display apparatus includes a substrate including a subpixel area, a pixel circuit layer arranged over the substrate and defining a pixel circuit overlapping the subpixel area, and a display element layer arranged over the pixel circuit layer and including a display element electrically connected to the pixel circuit, wherein the pixel circuit layer includes a lower inorganic insulating layer arranged over the substrate, a plurality of inorganic insulating patterns overlapping the subpixel area, arranged over the lower inorganic insulating layer, and spaced apart from each other in a plan view, and an organic insulating layer covering the plurality of inorganic insulating patterns.

20 Claims, 24 Drawing Sheets

DISPLAY APPARATUS INCLUDING PLURALITY OF INORGANIC INSULATING PATTERNS OVERLAPPING SUBPIXEL AREA AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2021-0082334, filed on Jun. 24, 2021, in the Korean Intellectual Property Office, the disclosure of which is incorporated by reference herein in its entirety.

BACKGROUND

1. Field

The technical field is related to display apparatuses.

2. Description of the Related Art

Display apparatuses may display images according to input signals. A small display apparatus may be included in a small electronic device such as a mobile phone. A large display apparatus may be included in a large electronic device such as a television.

A display apparatus may include pixels or subpixels that emit light to display images. Each of the pixels or subpixels may include a display element (or light-emitting element).

SUMMARY

One or more embodiments may be related to a display apparatus capable of displaying high-resolution images and capable of minimizing of defects in the event of an external impact.

Additional aspects will be set forth in part in the description which follows and, in part, will be apparent from the description, or may be learned by practice of the presented embodiments.

According to one or more embodiments, a display apparatus includes a substrate including a subpixel area, a pixel circuit layer arranged over the substrate and defining a pixel circuit overlapping the subpixel area, and a display element layer arranged over the pixel circuit layer and including a display element electrically connected to the pixel circuit, wherein the pixel circuit layer includes a lower inorganic insulating layer arranged over the substrate, a plurality of inorganic insulating patterns overlapping the subpixel area, arranged over the lower inorganic insulating layer, and spaced apart from each other in a plan view, and an organic insulating layer covering the plurality of inorganic insulating patterns.

In an embodiment, a portion of the organic insulating layer may be arranged inside a space defined between the plurality of inorganic insulating patterns adjacent to each other.

In an embodiment, the space may overlap the display element.

In an embodiment, the pixel circuit layer may further include a first conductive line arranged between one of the plurality of inorganic insulating patterns and the substrate and extending in a first direction, and a second conductive line arranged between another one of the plurality of inorganic insulating patterns and the substrate and extending in the first direction.

In an embodiment, the pixel circuit layer may further include a third conductive line arranged between the organic insulating layer and the display element layer, overlapping the subpixel area, and extending in a second direction intersecting with the first direction.

In an embodiment, the lower inorganic insulating layer may include a first gate insulating layer and a second gate insulating layer sequentially arranged over the substrate, and the pixel circuit layer may further include a semiconductor layer arranged between the substrate and the first gate insulating layer, a first gate conductive layer arranged between the first gate insulating layer and the second gate insulating layer, and a plurality of conductive patterns arranged between the plurality of inorganic insulating patterns and the organic insulating layer.

In an embodiment, each of the plurality of conductive patterns may be arranged over corresponding one of the plurality of inorganic insulating patterns.

In an embodiment, at least two of the plurality of conductive patterns may be arranged over one of the plurality of inorganic insulating patterns.

In an embodiment, the lower inorganic insulating layer may include a first gate insulating layer, a second gate insulating layer, a lower insulating layer, and a third gate insulating layer sequentially arranged over the substrate, and the pixel circuit layer may further include a first semiconductor layer arranged between the substrate and the first gate insulating layer and including a silicon semiconductor, a second semiconductor layer arranged between the lower insulating layer and the third gate insulating layer and including an oxide semiconductor, and a plurality of conductive patterns arranged between the plurality of inorganic insulating patterns and the organic insulating layer.

In an embodiment, the subpixel area may include a first subpixel area, a second subpixel area, and a third subpixel area, the plurality of inorganic insulating patterns may be arranged in the first subpixel area, the lower inorganic insulating layer may include a first lower inorganic insulating pattern overlapping the second subpixel area and a second lower inorganic insulating pattern overlapping the third subpixel area and spaced apart from the first lower inorganic insulating pattern in the plan view, and the pixel circuit layer may further include a first upper inorganic insulating pattern arranged over the first lower inorganic insulating pattern and a second upper inorganic insulating pattern arranged over the second lower inorganic insulating pattern and spaced apart from the first upper inorganic insulating pattern in the plan view.

According to one or more embodiments, a display apparatus includes a substrate including a subpixel area, a pixel circuit layer arranged over the substrate and defining a pixel circuit overlapping the subpixel area, and a display element layer arranged over the pixel circuit layer and including a display element electrically connected to the pixel circuit, wherein the pixel circuit layer includes a first conductive line and a second conductive line overlapping the subpixel area and extending in a first direction, a plurality of inorganic insulating patterns arranged over the first conductive line and the second conductive line and spaced apart from each other in a plan view, an organic insulating layer covering the plurality of inorganic insulating patterns, and a third conductive line arranged over the organic insulating layer and extending in a direction intersecting with the first direction.

In an embodiment, a portion of the organic insulating layer may be arranged inside a space defined between the plurality of inorganic insulating patterns adjacent to each other.

In an embodiment, the space may overlap the display element.

In an embodiment, the first conductive line may overlap one of the plurality of inorganic insulating patterns, and the second conductive line may overlap another one of the plurality of inorganic insulating patterns.

In an embodiment, the first conductive line may be a scan line configured to transmit a scan signal, and the second conductive line may be an emission control line configured to transmit an emission control signal.

In an embodiment, the pixel circuit layer may further include a lower inorganic insulating layer arranged between the substrate and the plurality of inorganic insulating patterns and including a first gate insulating layer and a second gate insulating layer that are sequentially stacked.

In an embodiment, the pixel circuit layer may further include a semiconductor layer arranged between the substrate and the first gate insulating layer, a first gate conductive layer arranged between the first gate insulating layer and the second gate insulating layer, and a plurality of conductive patterns arranged between the plurality of inorganic insulating patterns and the organic insulating layer.

In an embodiment, at least two of the plurality of conductive patterns may be arranged over one of the plurality of inorganic insulating patterns.

In an embodiment, the pixel circuit layer may further include a lower inorganic insulating layer arranged between the substrate and the plurality of inorganic insulating patterns and including a first gate insulating layer, a second gate insulating layer, a lower insulating layer, and a third gate insulating layer that are sequentially stacked, a first semiconductor layer arranged between the substrate and the first gate insulating layer and including a silicon semiconductor, a second semiconductor layer arranged between the lower insulating layer and the third gate insulating layer and including an oxide semiconductor, and a plurality of conductive patterns arranged between the plurality of inorganic insulating patterns and the organic insulating layer.

BRIEF DESCRIPTION OF THE DRAWINGS

The above and other aspects, features, and advantages of certain embodiments will be more apparent from the following description taken in conjunction with the accompanying drawings, in which.

Each of FIG. 3A

Each of FIG. 6A, FIG. 6B, FIG. 6C, FIG. 6D.

Each of FIG. 10A, FIG. 10B, FIG. 10C, FIG. 10D, FIG. 10E, FIG. 10F.

DETAILED DESCRIPTION

Figure 1:
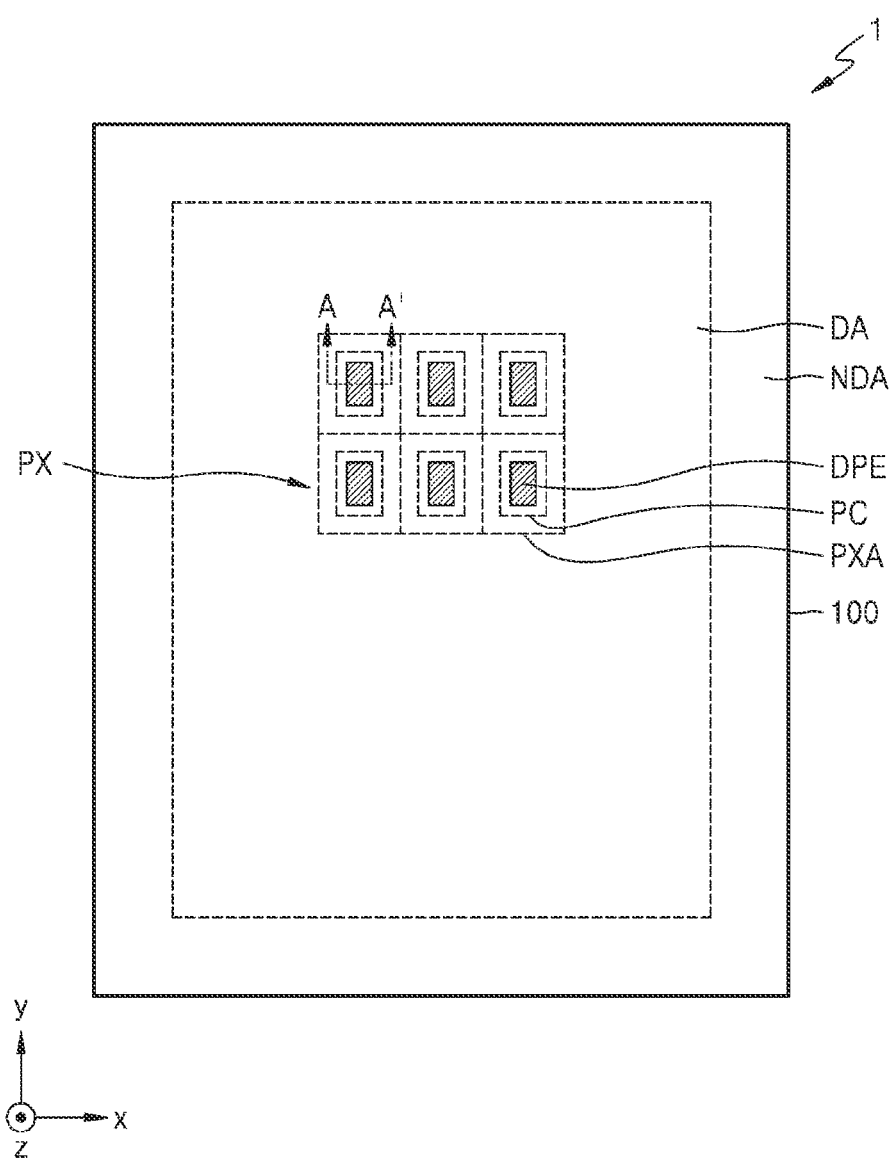
FIG. 1 is a plan view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

Although terms such as "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The singular forms "a," "an," and "the" may indicate the plural forms as well, unless the context clearly indicates otherwise.

Terms such as "comprise," "include," and "have" may specify the presence of stated features or components, but may not preclude the presence or addition of one or more other features or components.

When a layer, region, or element is referred to as being "on" another layer, region, or element, it may be "directly on" the other layer, region, or element or may be "indirectly on" the other layer, region, or element with one or more intervening layers, regions, or elements therebetween. That is, when first element is referred to as being "on" a second element, the first element may be "directly on" the second element or may be "indirectly on" the second element with one or more intervening elements between the first element and the second element.

Dimensions in the drawings may be exaggerated for convenience of description.

When a certain embodiment may be implemented differently, a particular process order may be different from the described order. For example, two consecutively described processes may be performed substantially at the same time or may be performed in an order opposite to the described order.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be formed of" or "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member" or "layer." The term "area" may mean "member," "section," or "part." The term "display element" may mean "light-emitting element." The term "over" may mean "on." The term "line" may mean "conductive line." The term "certain" may mean "predetermined." The expression that a space, groove, or opening overlaps an object may mean that (the position of) the space or opening overlaps with (the position of) the object. The "lower" and "upper" relative positions are illustrative and are when a display apparatus is oriented such that a substrate of the display is at the bottom of the display apparatus.

Display apparatuses described in this disclosure may be apparatuses displaying images and may be portable mobile apparatuses (such as game machines, multimedia apparatuses, or ultra-compact PCs) and/or relatively stationary apparatus (such as televisions). Display apparatuses described in this disclosure may include liquid crystal displays, electrophoretic displays, organic light emitting displays, inorganic EL displays (inorganic light emitting displays), field emission displays, surface-conduction electron-emitter displays, quantum dot displays, plasma displays, and cathode ray displays. Organic light emitting display apparatuses are described as examples.

FIG. 1 is a plan view schematically illustrating a display apparatus 1 according to an embodiment.

Referring to FIG. 1, the display apparatus 1 may include a substrate 100, a pixel circuit PC, and a display element DPE (or light-emitting element). The substrate 100 may include a display area DA and a non-display area NDA. The display apparatus 1 may display different images in the display area DA according to different input signals. The non-display area NDA may not display different images.

The display area DA may include a subpixel area PXA. In an embodiment, the display area DA may include a plurality of subpixel areas PXA. The plurality of subpixel areas PXA may be arranged in a first direction and a second direction intersecting with the first direction. The first direction and the second direction may be perpendicular to each other, may form an obtuse angle, or may form an acute angle therebetween. Hereinafter, a case where the first direction and the second direction are perpendicular to each other will be mainly described in detail. For example, the first direction may be the x direction or the −x direction in FIG. 1. The second direction may be the y direction or the −y direction in FIG. 1.

The pixel circuit PC may transmit an electrical signal to the display element DPE and may control the display element DPE. In an embodiment, the pixel circuit PC may be arranged in the subpixel area PXA. In an embodiment, a plurality of pixel circuits PC may be respectively arranged in a plurality of subpixel areas PXA. In this case, the subpixel area PXA may be defined as an area in which the pixel circuit PC is arranged. In an embodiment, the pixel circuit PC may include at least one thin film transistor and at least one storage capacitor.

The display element DPE may emit light and may be arranged in the subpixel area PXA. In an embodiment, a plurality of display elements DPE may be respectively arranged in a plurality of subpixel areas PXA. That is, the subpixel area PXA may be defined as an area in which the display element DPE is arranged.

The display element DPE may receive an electrical signal from the pixel circuit PC and may emit light according to the electrical signal. In this case, the display element DPE may define a subpixel PX. Because a plurality of display elements DPE may emit light, the display apparatus 1 may display an image in the display area DA.

The display element DPE may be an organic light emitting diode including an organic emission layer. Alternatively, the display element DPE may be a light emitting diode (LED). The size of the light emitting diode (LED) may be a micro scale or a nano scale. For example, the light emitting diode may be a micro light emitting diode. Alternatively, the light emitting diode may be a nanorod light emitting diode. The nanorod light emitting diode may include gallium nitride (GaN). In an embodiment, a color conversion layer may be arranged over the nanorod light emitting diode. The color conversion layer may include quantum dots. Alternatively, the display element DPE may be a quantum dot light emitting diode including a quantum dot emission layer. Alternatively, the display element DPE may be an inorganic light emitting diode including an inorganic semiconductor. Hereinafter, a case where the display element DPE is an organic light emitting diode will be mainly described in detail.

Figure 2:
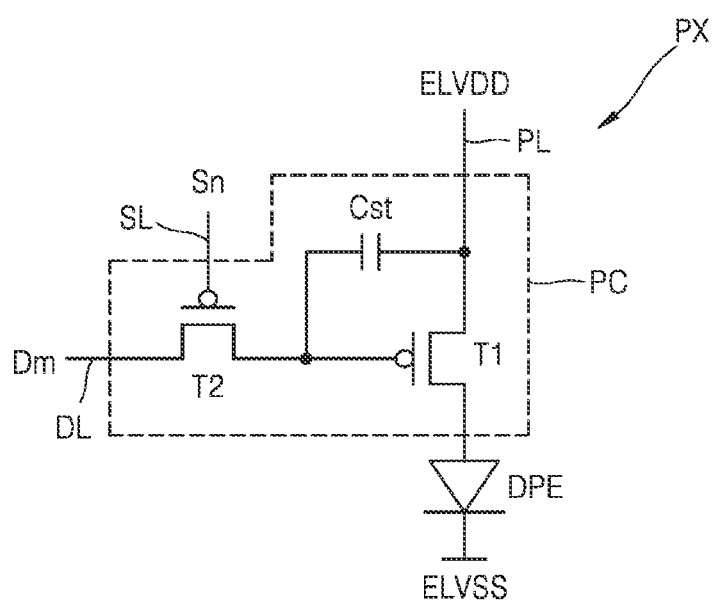
FIG. 2 is an equivalent circuit diagram of a subpixel included in a display apparatus, according to an embodiment.

FIG. 2 is an equivalent circuit diagram of a subpixel PX included in a display apparatus, according to an embodiment.

Referring to FIG. 2, the subpixel PX may define or include a display element DPE electrically connected to a pixel circuit PC. The pixel circuit PC may include a driving thin film transistor T1, a switching thin film transistor T2, and a storage capacitor Cst. The subpixel PX may emit, for example, red, green, or blue light or red, green, blue, or white light through the display element DPE.

The switching thin film transistor T2 may be electrically connected to a scan line SL and a data line DL and may be configured to transmit a data voltage or a data signal Dm input from the data line DL to the driving thin film transistor T1 according to a scan voltage or a scan signal Sn input from the scan line SL.

The storage capacitor Cst may be electrically connected to the switching thin film transistor T2 and a driving voltage line PL and may store a voltage corresponding to the difference between a voltage received from the switching thin film transistor T2 and a first power voltage ELVDD supplied to the driving voltage line PL.

The driving thin film transistor T1 may be connected to the driving voltage line PL and the storage capacitor Cst and may control a driving current flowing from the driving voltage line PL through the display element DPE in response to a voltage value stored in the storage capacitor Cst. The display element DPE may emit light with a certain brightness according to the driving current. An opposite electrode (e.g., a cathode) of the display element DPE may be supplied with a second power voltage ELVSS.

Although FIG. 2 illustrates that the pixel circuit PC includes two thin film transistors and one storage capacitor, the pixel circuit PC may include three or more thin film transistors.

Figure 3A:
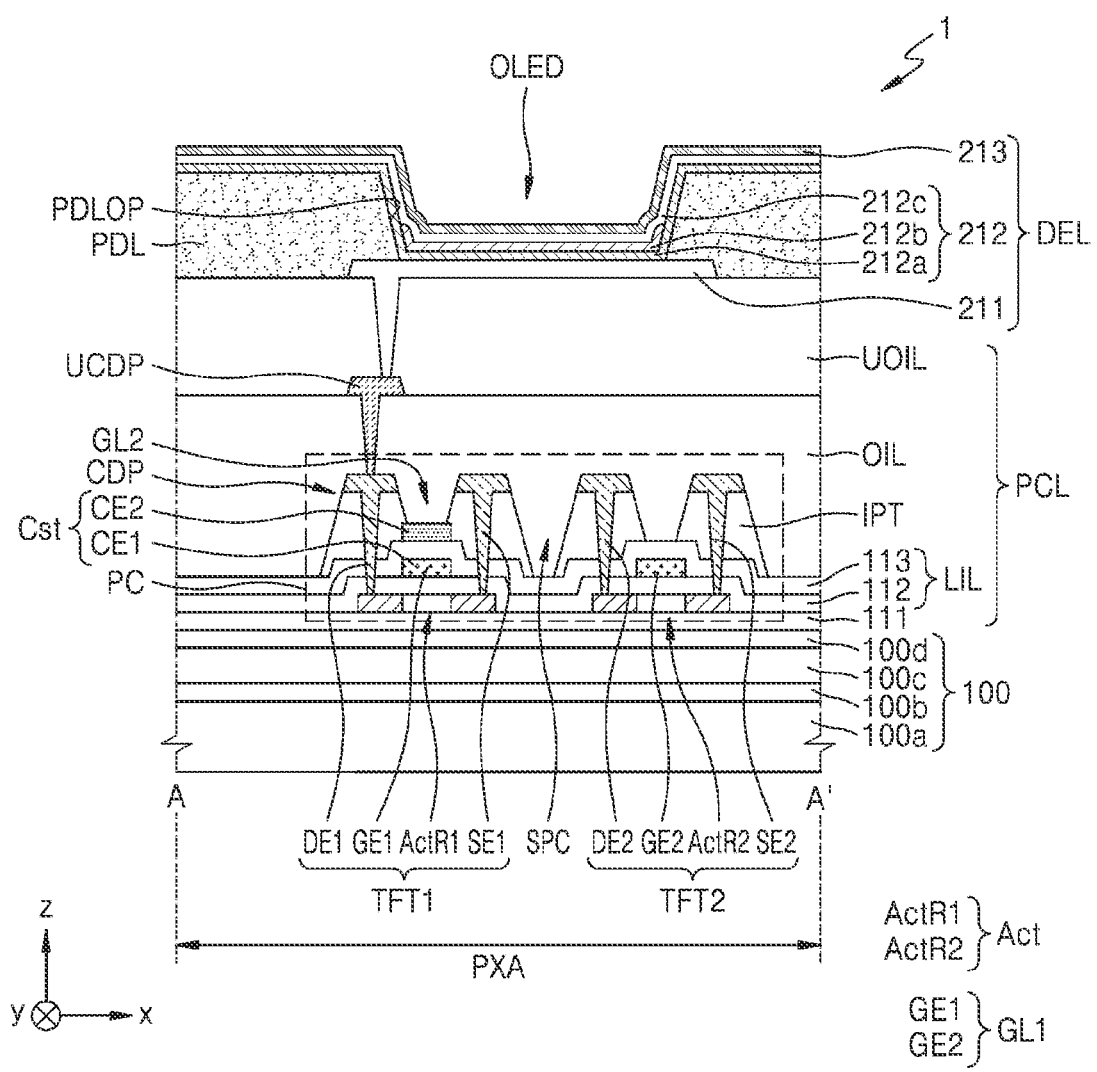
FIG. 3B is a cross-sectional view illustrating the display apparatus of FIG. 1 taken along line A-A', according to an embodiment.
Figure 3B:
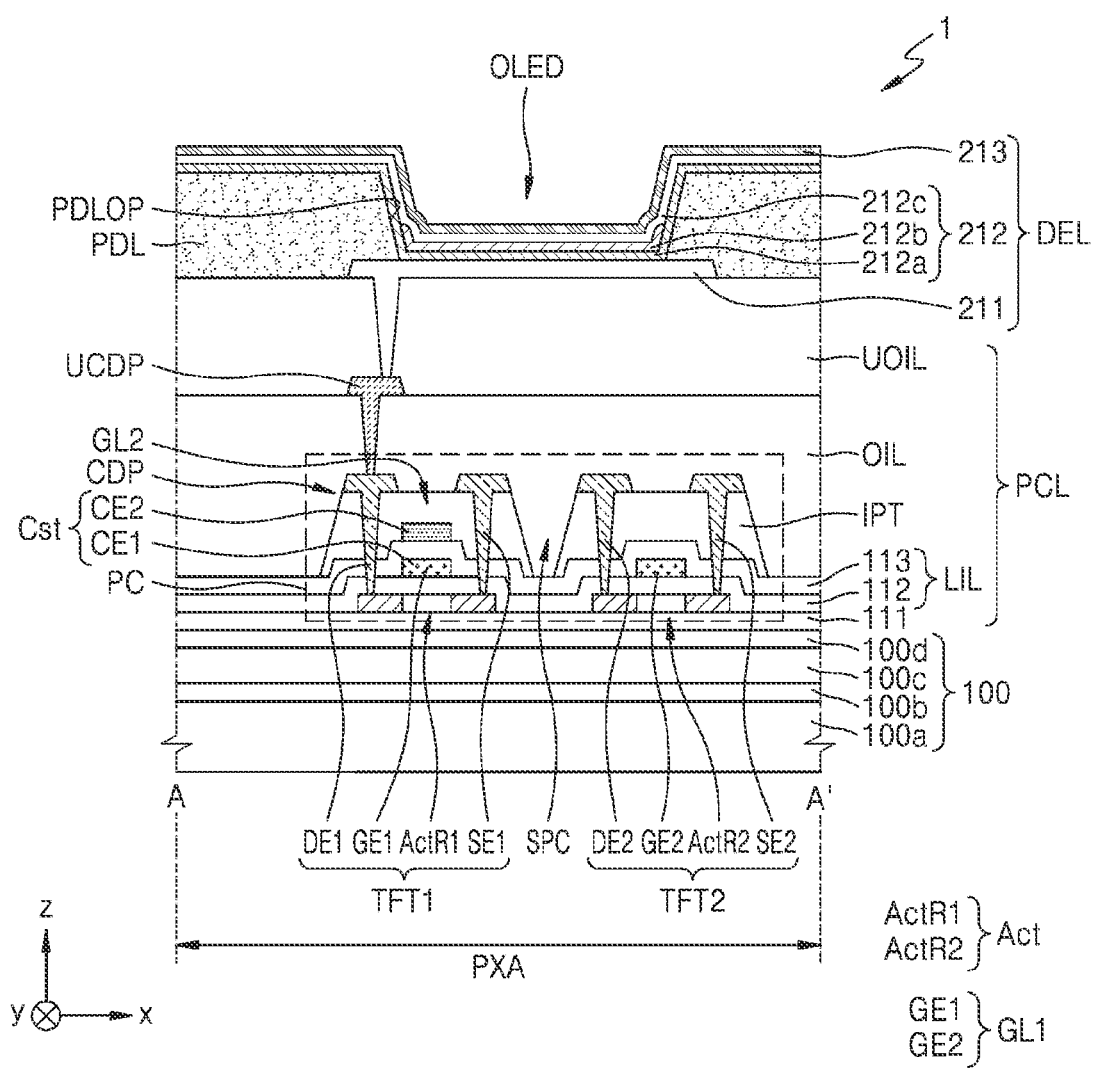

Each of FIG. 3A and FIG. 3B is a cross-sectional view illustrating the display apparatus 1 of FIG. 1 taken along line A-A', according to an embodiment.

Referring to FIGS. 3A and 3B, the display apparatus 1 may include a substrate 100, a pixel circuit layer PCL, and a display element layer DEL. The pixel circuit layer PCL may define a pixel circuit PC. In other words, the pixel circuit layer PCL may include a pixel circuit PC. The display element layer DEL may include an organic light emitting diode OLED as a display element.

The substrate 100 may include a subpixel area PXA. In an embodiment, the substrate 100 may include a plurality of subpixel areas PXA. In an embodiment, one pixel circuit PC may be arranged in the subpixel area PXA. In an embodiment, the organic light emitting diode OLED may be arranged in the subpixel area PXA.

In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked in the substrate 100. In other embodiments, the substrate 100 may include glass.

At least one of the first base layer 100a and the second base layer 100c may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The first barrier layer 100b and the second barrier layer 100d may be barrier layers for preventing penetration of external substances and may include a single layer or multiple layers including an inorganic material such as silicon nitride ($SiN_x$), silicon oxide ($SiO_2$), and/or silicon oxynitride (SiON).

The pixel circuit layer PCL defining the pixel circuit PC may be arranged over the substrate 100. The pixel circuit PC may overlap the subpixel area PXA. The pixel circuit PC may include at least one thin film transistor and/or at least one storage capacitor. In an embodiment, the pixel circuit PC may include a first thin film transistor TFT1, a second thin film transistor TFT2, and a storage capacitor Cst. The first thin film transistor TFT1 may include a first semiconductor area ActR1, a first gate electrode GE1, a first source electrode SE1, and a first drain electrode DE1. The second thin film transistor TFT2 may include a second semiconductor area ActR2, a second gate electrode GE2, a second source electrode SE2, and a second drain electrode DE2. The storage capacitor Cst may include a first electrode CE1 and a second electrode CE2.

The pixel circuit layer PCL may include a buffer layer 111, a semiconductor layer Act, a lower inorganic insulating layer LIL, a first gate conductive layer GL1, a second gate conductive layer GL2, a plurality of inorganic insulating patterns IPT, a plurality of conductive patterns CDP, an organic insulating layer OIL, an upper conductive pattern UCDP, and an upper organic insulating layer UOIL.

The buffer layer 111 may be arranged over the substrate 100. The buffer layer 111 may include an inorganic insulating material such as silicon nitride ($SiN_x$), silicon oxynitride (SiON), and silicon oxide ($SiO_2$) and may include a single layer or multiple layers including the inorganic insulating material.

The semiconductor layer Act may be arranged over the buffer layer 111. The semiconductor layer Act may include polysilicon. Alternatively, the semiconductor layer Act may include amorphous silicon, may include an oxide semiconductor, or may include an organic semiconductor or the like. In an embodiment, the semiconductor layer Act may include a first semiconductor area ActR1 and a second semiconductor area ActR2.

The lower inorganic insulating layer LIL may be arranged over the substrate 100. In an embodiment, the lower inorganic insulating layer LIL may be continuously arranged over the substrate 100. In an embodiment, the lower inorganic insulating layer LIL may include a groove. The lower inorganic insulating layer LIL may include a first gate insulating layer 112 and a second gate insulating layer 113 that are sequentially arranged over the substrate 100.

The first gate insulating layer 112 may cover the semiconductor layer Act. In other words, the semiconductor layer Act may be arranged between the substrate 100 and the first gate insulating layer 112. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$, which may be ZnO and/or $ZnO_2$).

The first gate conductive layer GL1 may be arranged over the first gate insulating layer 112. In an embodiment, the first gate conductive layer GL1 may be arranged between the first gate insulating layer 112 and the second gate insulating layer 113. The first gate conductive layer GL1 may include a low-resistance metal material. In an embodiment, the first gate conductive layer GL1 may include a conductive material including molybdenum (Mo), aluminum (Al), copper (Cu), titanium (Ti), or the like and may include a single layer or multiple layers including some of the above materials.

In an embodiment, the first gate conductive layer GL1 may include a first gate electrode GE1 and a second gate electrode GE2. The first gate electrode GE1 may overlap the first semiconductor area ActR1. The second gate electrode GE2 may overlap the second semiconductor area ActR2.

The second gate insulating layer 113 may cover the first gate conductive layer GL1. Like the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$, which may be ZnO and/or $ZnO_2$).

The second gate conductive layer GL2 may be arranged over the second gate insulating layer 113. The second gate conductive layer GL2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers of some of the above materials.

The second gate conductive layer GL2 may include a second electrode CE2. In an embodiment, the second electrode CE2 may overlap the first gate electrode GE1 thereunder. In this case, the first gate electrode GE1 and the second electrode CE2 with intervening the second gate insulating layer 113 may form the storage capacitor Cst. That is, the first gate electrode GE1 may function as the first electrode CE1 of the storage capacitor Cst.

As such, the storage capacitor Cst and the first thin film transistor TFT1 may overlap each other. In some embodiments, the storage capacitor Cst may not overlap the first thin film transistor TFT1.

The plurality of inorganic insulating patterns IPT may be arranged in the subpixel area PXA. In other words, the plurality of inorganic insulating patterns IPT may overlap the subpixel area PXA. That is, the plurality of inorganic insulating patterns IPT may overlap one subpixel area PXA.

The plurality of inorganic insulating patterns IPT may be arranged over the lower inorganic insulating layer LIL. In an embodiment, the plurality of inorganic insulating patterns IPT may be arranged over the second gate insulating layer 113 and/or the first gate insulating layer 112.

The plurality of inorganic insulating patterns IPT may be spaced apart from each other in a direction parallel to the substrate 100. That is, the plurality of inorganic insulating patterns IPT may be spaced apart from each other in a plan view, e.g., in the plan view defined by the first direction (e.g., the x direction or the −x direction) and the second direction (e.g., the y direction or the −y direction). The plurality of inorganic insulating patterns IPT may be formed of a same material. In an embodiment, the plurality of inorganic insulating patterns IPT may be spaced apart from each other in the subpixel area PXA. A space SPC may be defined between the plurality of inorganic insulating patterns IPT adjacent to each other. The space SPC may be arranged in the subpixel area PXA and may overlap the organic light emitting diode OLED as a display element. In some embodiments, when the lower inorganic insulating layer LIL includes a groove, the groove may overlap the space SPC between adjacent inorganic insulating patterns IPT.

The plurality of inorganic insulating patterns IPT may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$, which may be ZnO and/or $ZnO_2$).

The plurality of conductive patterns CDP may be arranged over the plurality of inorganic insulating patterns IPT. In an embodiment, the plurality of conductive patterns CDP may include a first source electrode SE1, a first drain electrode DE1, a second source electrode SE2, and a second drain electrode DE2. Each of the first source electrode SE1, the first drain electrode DE1, the second source electrode SE2, and the second drain electrode DE2 may be electrically connected to the semiconductor layer Act through a contact hole included in the lower inorganic insulating layer LIL and the plurality of inorganic insulating patterns IPT.

The plurality of conductive patterns CDP may include a high-conductivity material. The plurality of conductive patterns CDP may include a conductive material including molybdenum (Mo), aluminum (Al), copper (Cu), titanium (Ti), or the like and may include a single layer or multiple layers including some of the above materials. In an embodiment, the plurality of conductive patterns CDP may include a multilayer structure of Ti/Al/Ti.

Referring to FIG. 3A, the plurality of conductive patterns CDP may be respectively arranged over/on the plurality of inorganic insulating patterns IPT. That is, each of the plurality of conductive patterns CDP may be arranged over/on corresponding one of the plurality of inorganic insulating patterns IPT. For example, the first source electrode SE1, the first drain electrode DE1, the second source electrode SE2, and the second drain electrode DE2 may be respectively arranged over the plurality of inorganic insulating patterns IPT (e.g., four inorganic insulating patterns IPT). In this case, an inorganic layer may be formed over the lower inorganic insulating layer LIL, and a plurality of conductive patterns CDP may be formed over the inorganic layer. Then, a plurality of inorganic insulating patterns IPT may be formed by removing at least a portion of the inorganic layer using the plurality of conductive patterns CDP as a mask. Alternatively, a plurality of inorganic insulating patterns IPT may be formed by respectively forming a plurality of photoresist patterns over the plurality of conductive patterns CDP and then removing at least a portion of the inorganic layer.

Referring to FIG. 3B, at least two of the plurality of conductive patterns CDP may be arranged over/on one of the plurality of inorganic insulating patterns IPT. In other words, at least two of the plurality of conductive patterns CDP may be arranged over/on one inorganic insulating pattern IPT. For example, the first source electrode SE1 and the first drain electrode DE1 may be arranged over one of the plurality of inorganic insulating patterns IPT. The second source electrode SE2 and the second drain electrode DE2 may be arranged over another one of the plurality of inorganic insulating patterns IPT. In this case, an inorganic layer may be formed over the lower inorganic insulating layer LIL, and a plurality of conductive patterns CDP may be formed over the inorganic layer. Then, a plurality of photoresist patterns overlapping the plurality of conductive patterns CDP may be formed. One of the plurality of photoresist patterns may overlap the plurality of conductive patterns CDP. Then, a plurality of inorganic insulating patterns IPT may be formed by removing at least a portion of the inorganic layer.

Referring back to FIGS. 3A and 3B, the organic insulating layer OIL may cover the plurality of inorganic insulating patterns IPT. The organic insulating layer OIL may fill the space(s) SPC defined between the plurality of inorganic insulating patterns IPT adjacent to each other. A portion of the organic insulating layer OIL may be arranged inside the space SPC defined between the plurality of inorganic insulating patterns IPT adjacent to each other. The organic insulating layer OIL may cover the plurality of conductive patterns CDP. In an embodiment, the plurality of conductive patterns CDP may be arranged between the plurality of inorganic insulating patterns IPT and the organic insulating layer OIL.

The organic insulating layer OIL may include an organic material. For example, the organic insulating layer OIL may include an organic insulating material such as a general-purpose polymer such as polymethylmethacrylate (PMMA) or polystyrene (PS), a polymer derivative having a phenolic group, an acryl-based polymer, an imide-based polymer, an aryl ether-based polymer, an amide-based polymer, a fluorine-based polymers, a p-xylene-based polymer, a vinyl alcohol-based polymer, or a blend of some of the above materials.

If, instead of spaced inorganic insulating patterns IPT, an inorganic layer is continuously arranged over the lower inorganic insulating layer LIL, the display apparatus 1 may be damaged by external impact. For example, the external impact may damage the plurality of conductive patterns CDP disposed on the continuous inorganic layer. In embodiments, because the display apparatus 1 includes the plurality of inorganic insulating patterns IPT spaced apart from each other, damage to the display apparatus 1 due to an external impact may be prevented or reduced. For example, even when a crack occurs in one of the plurality of inorganic insulating patterns IPT due to an external impact, the crack may not be transmitted to another one of the plurality of inorganic insulating patterns IPT. Also, because the plurality of inorganic insulating patterns IPT are spaced apart from each other, the strain of the plurality of inorganic insulating patterns IPT may be reduced.

The plurality of inorganic insulating patterns IPT may be spaced apart from each other in the subpixel area PXA, and the space SPC between the plurality of inorganic insulating patterns IPT adjacent to each other may overlap the organic light emitting diode OLED as a display element. Although, the display apparatus 1 includes the plurality of inorganic insulating patterns IPT, the area of the subpixel area PXA not overlapping the display element may not need to be increased and the image resolution of the display apparatus 1 may be maintained high.

The upper conductive pattern UCDP may be arranged over the organic insulating layer OIL. The upper conductive pattern UCDP may be electrically connected to one of the plurality of conductive patterns CDP through a contact hole of the organic insulating layer OIL. For example, the upper conductive pattern UCDP may be electrically connected to the first drain electrode DE1 through a contact hole of the organic insulating layer OIL.

The upper conductive pattern UCDP may include a high-conductivity material. The upper conductive pattern UCDP may include a conductive material including molybdenum (Mo), aluminum (Al), copper (Cu), titanium (Ti), or the like and may include a single layer or multiple layers including some of the above materials. In an embodiment, the upper conductive pattern UCDP may include a multilayer structure of Ti/Al/Ti.

The upper organic insulating layer UOIL may cover the upper conductive pattern UCDP. The upper organic insulating layer UOIL may include an organic material. The upper organic insulating layer UOIL may include an organic insulating material such as a general-purpose polymer such as polymethylmethacrylate (PMMA) or polystyrene (PS), a polymer derivative having a phenolic group, an acryl-based polymer, an imide-based polymer, an aryl ether-based polymer, an amide-based polymer, a fluorine-based polymers, a p-xylene-based polymer, a vinyl alcohol-based polymer, or a blend of some of the above materials.

The display element layer DEL may be arranged over the pixel circuit layer PCL. The display element layer DEL may include an organic light emitting diode OLED as a display element electrically connected to the pixel circuit PC. The organic light emitting diode OLED may include a pixel electrode 211, an intermediate layer 212, and an opposite electrode 213.

The pixel electrode 211 may be electrically connected to the upper conductive pattern UCDP through a contact hole of the upper organic insulating layer UOIL. Thus, the organic light emitting diode OLED may be electrically connected to the pixel circuit PC.

The pixel electrode 211 may include a conductive oxide such as indium tin oxide (ITO), indium zinc oxide (IZO), zinc oxide ($ZnO_x$, which may be ZnO and/or $ZnO_2$), indium oxide ($In_2O_3$), indium gallium oxide (IGO), or aluminum zinc oxide (AZO). In other embodiments, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound or alloy of some of the above materials. In other embodiments, the pixel electrode 211 may further include a layer formed of ITO, IZO, ZnO which may be ZnO and/or $ZnO_2$, or $In_2O_3$ over/under the reflective layer.

A pixel definition layer PDL including an opening PDLOP exposing a center portion of the pixel electrode 211 may be arranged over the pixel electrode 211. The pixel definition layer PDL may include an organic insulating material and/or an inorganic insulating material. The opening PDLOP may define an emission area of light emitted from the organic light emitting diode OLED. For example, the width of the opening PDLOP may correspond to the width of the emission area.

The intermediate layer 212 may be arranged over the pixel definition layer PDL and the pixel electrode 211. The intermediate layer 212 may include an emission layer 212b arranged in the opening PDLOP of the pixel definition layer PDL. The emission layer 212b may include a high-molecular or low-molecular weight organic material for emitting light of a certain color.

A first functional layer 212a and a second functional layer 212c may be respectively arranged under and over the emission layer 212b. The first functional layer 212a may include, for example, a hole transport layer (HTL) or may include an HTL and a hole injection layer (HIL). The second functional layer 212c may be a component arranged over the emission layer 212b and may be optional. The second functional layer 212c may include an electron transport layer (ETL) and/or an electron injection layer (EIL). Like the opposite electrode 213 described below, the first functional layer 212a and/or the second functional layer 212c may be a common layer formed to entirely cover the substrate 100.

The opposite electrode 213 may be arranged over the intermediate layer 212. The opposite electrode 213 may include a conductive material having a low work function. For example, the opposite electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 213 may further include a layer such as ITO, IZO, ZnO which may be ZnO and/or $ZnO_2$, or $In_2O_3$ over the (semi)transparent layer.

In some embodiments, a capping layer (not illustrated) may be further arranged over the opposite electrode 213. The capping layer may include LiF, an inorganic material, and/or an organic material. In some embodiments, an encapsulation layer for encapsulating the organic light emitting diode OLED may be further included over the opposite electrode 213.

Figure 4:
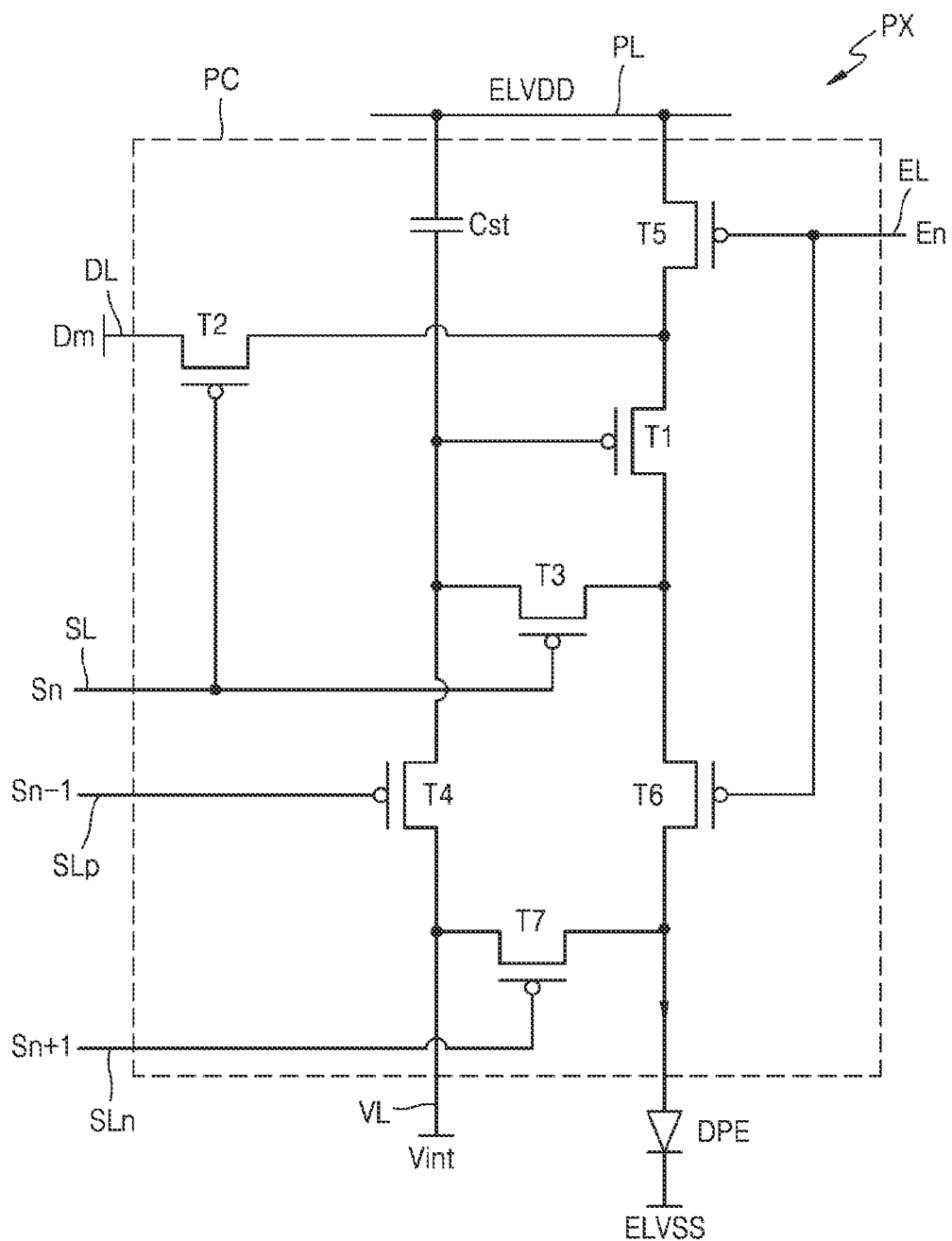
FIG. 4 is an equivalent circuit diagram of a subpixel included in a display apparatus, according to an embodiment.

FIG. 4 is an equivalent circuit diagram of a subpixel PX included in a display apparatus, according to an embodiment.

Referring to FIG. 4, a pixel circuit PC may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, and a storage capacitor Cst.

FIG. 4 illustrates a case where signal lines SL, SLp, SLn, EL, and DL, an initialization voltage line VL, and a driving voltage line PL are provided for each pixel circuit PC; however, in other embodiments, at least one of the signal lines SL, SLp, SLn, EL, and DL and/or the initialization voltage line VL may be shared by adjacent pixel circuits.

The driving drain electrode of the driving thin film transistor T1 may be electrically connected to a display element DPE via the emission control thin film transistor T6. The driving thin film transistor T1 may receive a data signal Dm according to a switching operation of the switching thin film transistor T2 and supply a driving current to the display element DPE.

The switching gate electrode of the switching thin film transistor T2 may be electrically connected to the scan line SL, and the switching source electrode thereof may be electrically connected to the data line DL. The switching drain electrode of the switching thin film transistor T2 may be electrically connected to the driving voltage line PL via the operation control thin film transistor T5 while being electrically connected to the driving source electrode of the driving thin film transistor T1. The switching thin film transistor T2 may be turned on according to a scan signal Sn received through the scan line SL, to perform a switching operation of transmitting the data signal Dm transmitted to the data line DL to the driving source electrode of the driving thin film transistor T1.

The compensation gate electrode of the compensation thin film transistor T3 may be electrically connected to the scan line SL. The compensation source electrode of the compensation thin film transistor T3 may be electrically connected to the pixel electrode of the display element DPE via the emission control thin film transistor T6 and may be connected to the driving drain electrode of the driving thin film transistor T1. The compensation drain electrode of the compensation thin film transistor T3 may be electrically connected to any one electrode of the storage capacitor Cst, the first initialization source electrode of the first initialization thin film transistor T4, and the driving gate electrode of the driving thin film transistor T1. The compensation thin film transistor T3 may be turned on according to the scan signal Sn received through the scan line SL, to connect the driving gate electrode and the driving drain electrode of the driving thin film transistor T1 to each other to diode-connect the driving thin film transistor T1.

The first initialization gate electrode of the first initialization thin film transistor T4 may be electrically connected to the previous scan line SLp. The first initialization drain electrode of the first initialization thin film transistor T4 may be electrically connected to the initialization voltage line VL. The first initialization source electrode of the first initialization thin film transistor T4 may be electrically connected to any one electrode of the storage capacitor Cst, the compensation drain electrode of the compensation thin film transistor T3, and the driving gate electrode of the driving thin film transistor T1. The first initialization thin film transistor T4 may be turned on according to a previous scan signal Sn−1 received through the previous scan line SLp, to perform an initialization operation of initializing the voltage of the driving gate electrode of the driving thin film transistor T1 by transmitting an initialization voltage Vint to the driving gate electrode of the driving thin film transistor T1.

The operation control gate electrode of the operation control thin film transistor T5 may be electrically connected to the emission control line EL. The operation control source electrode of the operation control thin film transistor T5 may be electrically connected to the driving voltage line PL. The operation control drain electrode of the operation control thin film transistor T5 may be electrically connected to the driving source electrode of the driving thin film transistor T1 and the switching drain electrode of the switching thin film transistor T2.

The emission control gate electrode of the emission control thin film transistor T6 may be electrically connected to the emission control line EL. The emission control source electrode of the emission control thin film transistor T6 may be electrically connected to the driving drain electrode of the driving thin film transistor T1 and the compensation source electrode of the compensation thin film transistor T3. The emission control drain electrode of the emission control thin film transistor T6 may be electrically connected to the pixel electrode of the display element DPE. The operation control thin film transistor T5 and the emission control thin film transistor T6 may be simultaneously turned on according to an emission control signal En received through the emission control line EL, such that a first power voltage ELVDD may be transmitted to the display element DPE and a driving current may flow through the display element DPE.

The second initialization gate electrode of the second initialization thin film transistor T7 may be electrically connected to the next scan line SLn. The second initialization source electrode of the second initialization thin film transistor T7 may be electrically connected to the pixel electrode of the display element DPE. The second initialization drain electrode of the second initialization thin film transistor T7 may be electrically connected to the initialization voltage line VL. The second initialization thin film transistor T7 may be turned on according to a next scan signal Sn+1 received through the next scan line SLn, to initialize the pixel electrode of the display element DPE.

FIG. 4 illustrates that the first initialization thin film transistor T4 and the second initialization thin film transistor T7 are respectively electrically connected to the previous scan line SLp and the next scan line SLn; however, in other embodiments, both the first initialization thin film transistor T4 and the second initialization thin film transistor T7 may be electrically connected to the previous scan line SLp to be driven according to the previous scan signal Sn−1.

The other electrode of the storage capacitor Cst may be electrically connected to the driving voltage line PL. One electrode of the storage capacitor Cst may be electrically connected to the driving gate electrode of the driving thin film transistor T1, the compensation drain electrode of the compensation thin film transistor T3, and the first initialization source electrode of the first initialization thin film transistor T4.

An opposite electrode (e.g., a cathode) of the display element DPE may be provided with a second power voltage ELVSS. The display element DPE may emit light by receiving a driving current from the driving thin film transistor T1.

An operation of the subpixel PX may be as follows.

During an initialization period, the first initialization thin film transistor T4 may be turned on in response to the previous scan signal Sn−1 through the previous scan line SLp, and the driving thin film transistor T1 may be initialized by the initialization voltage Vint supplied from the initialization voltage line VL.

During a data programming period, when the scan signal Sn is supplied through the scan line SL, the switching thin film transistor T2 and the compensation thin film transistor T3 may be turned on in response to the scan signal Sn. The driving thin film transistor T1 may be diode-connected and forward-biased by the turned-on compensation thin film transistor T3.

A compensation voltage Dm+Vth (Vth is a negative value), which is obtained by subtracting a threshold voltage Vth of the driving thin film transistor T1 from the data signal Dm supplied from the data line DL, may be applied to the driving gate electrode of the driving thin film transistor T1.

The first power voltage ELVDD and the compensation voltage Dm+Vth may be applied to two ends of the storage capacitor Cst, and the charge corresponding to the voltage difference between the two ends of the storage capacitor Cst may be stored in the storage capacitor Cst.

During an emission period, the operation control thin film transistor T5 and the emission control thin film transistor T6 may be turned on by the emission control signal En supplied from the emission control line EL. A driving current may be generated according to the voltage difference between the first power voltage ELVDD and the voltage of the driving gate electrode of the driving thin film transistor T1, and the driving current may be supplied through the emission control thin film transistor T6 to the display element DPE.

Figure 5:
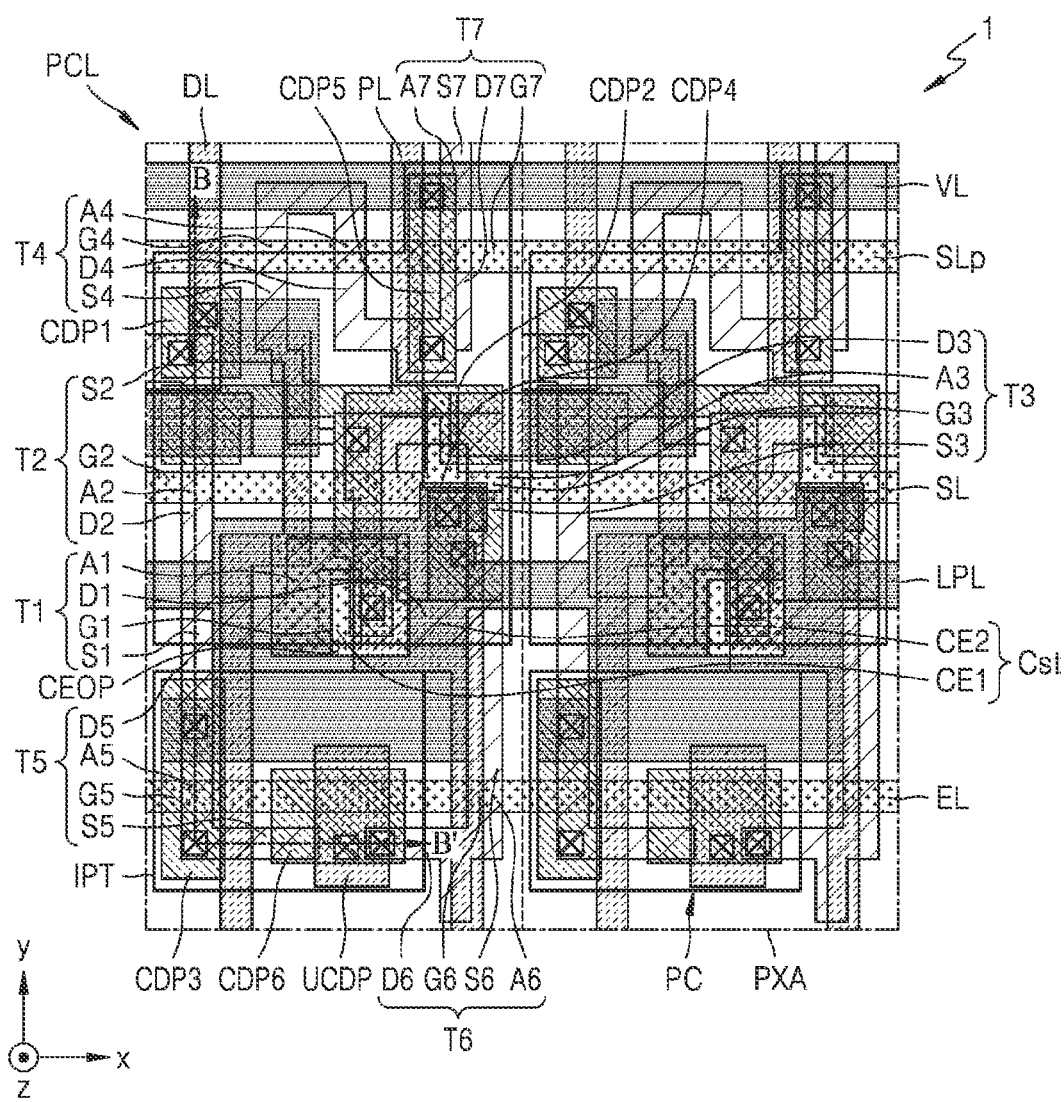
FIG. 5 is a plan view schematically illustrating a subpixel area and a pixel circuit layer of a display apparatus, according to an embodiment.
Figure 6A:
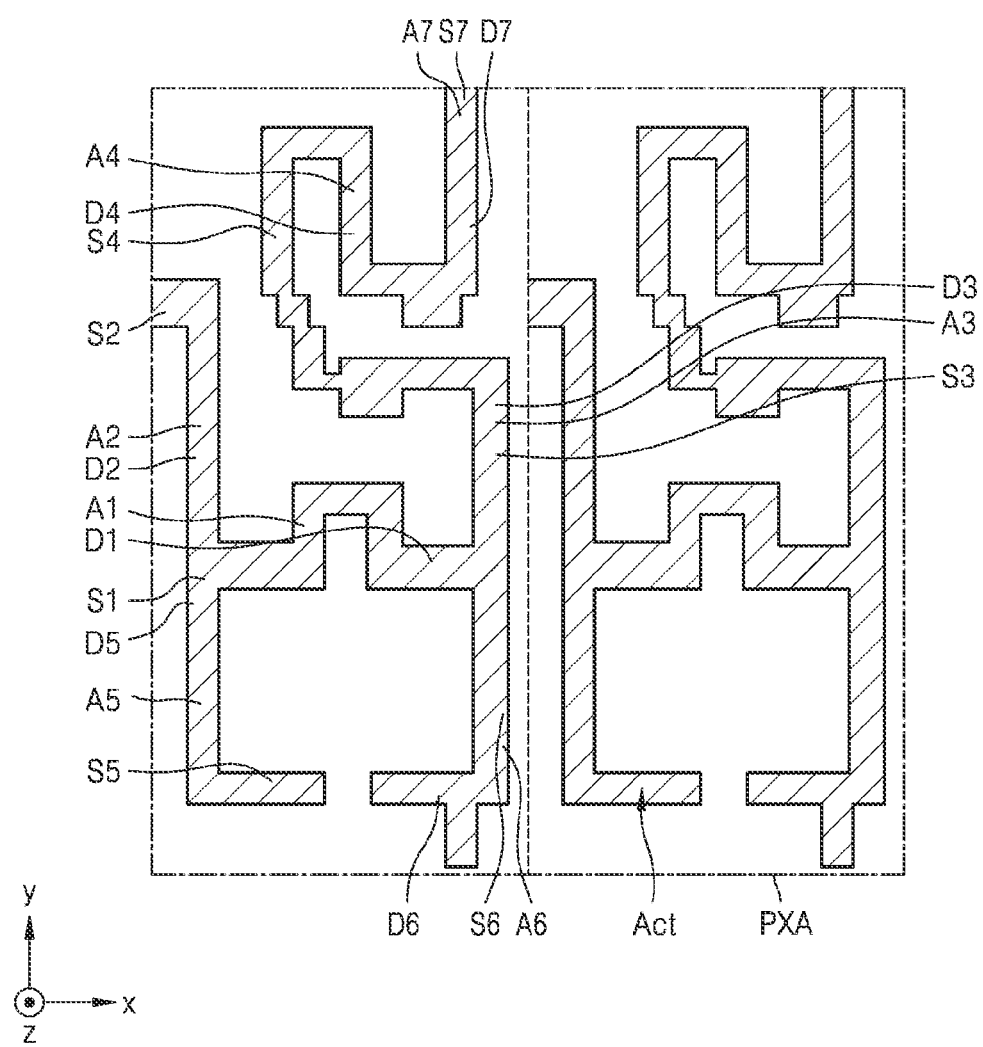
FIG. 6E is a plan view illustrating components of the display apparatus of FIG. 5 according to an embodiment.
Figure 6B:
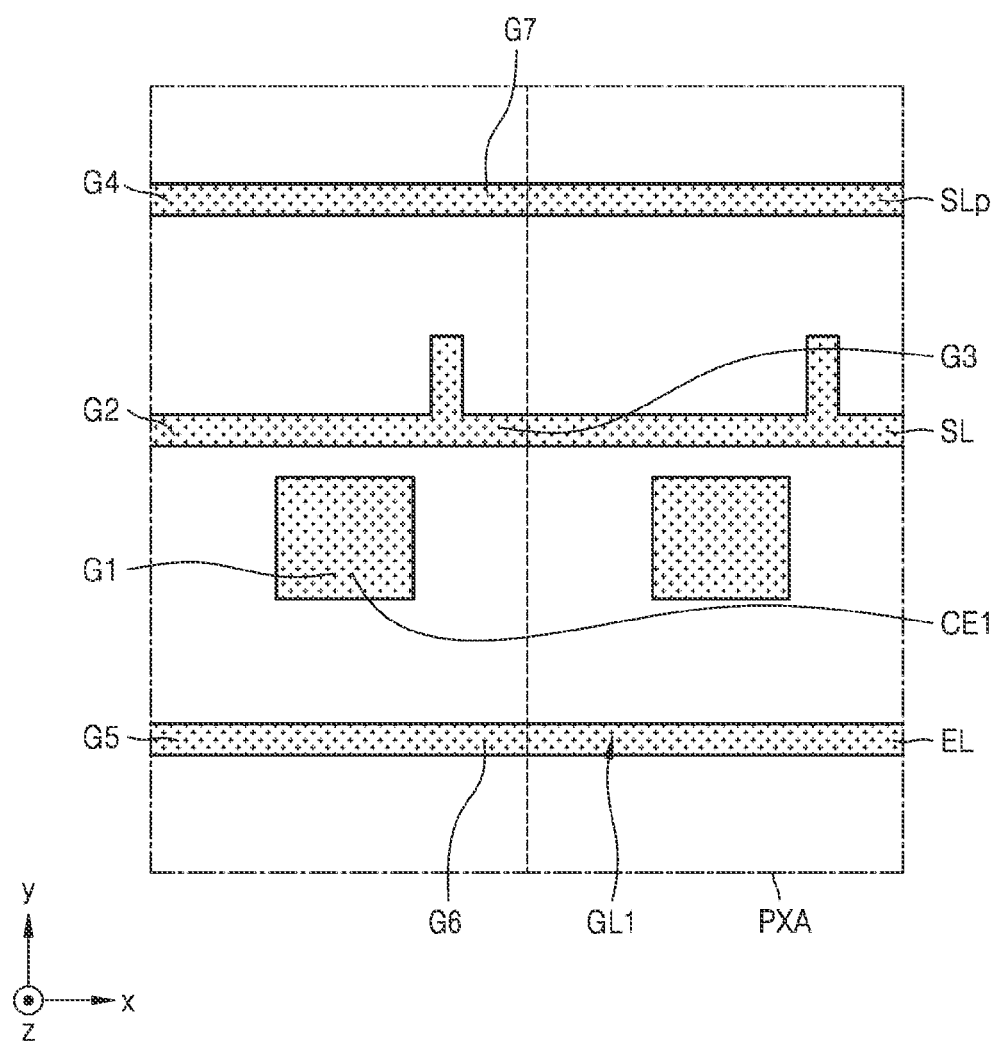
Figure 6C:
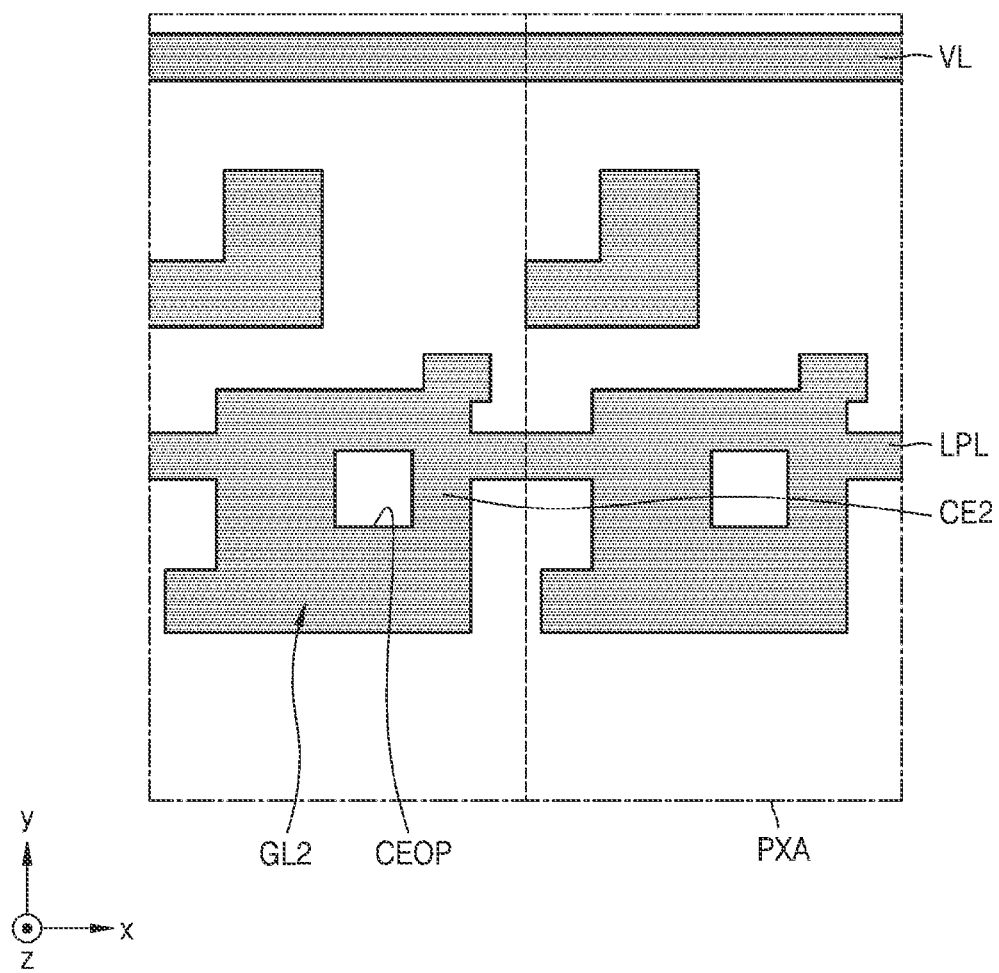
Figure 6D:
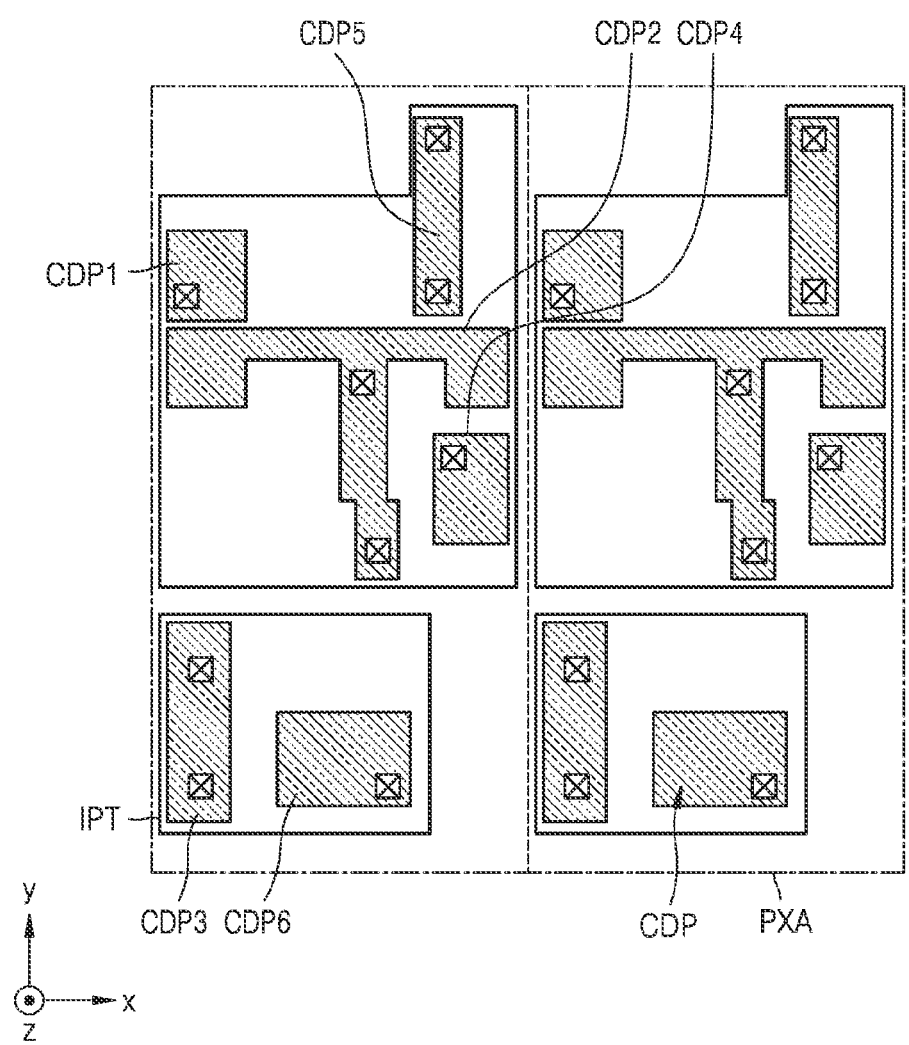
Figure 6E:
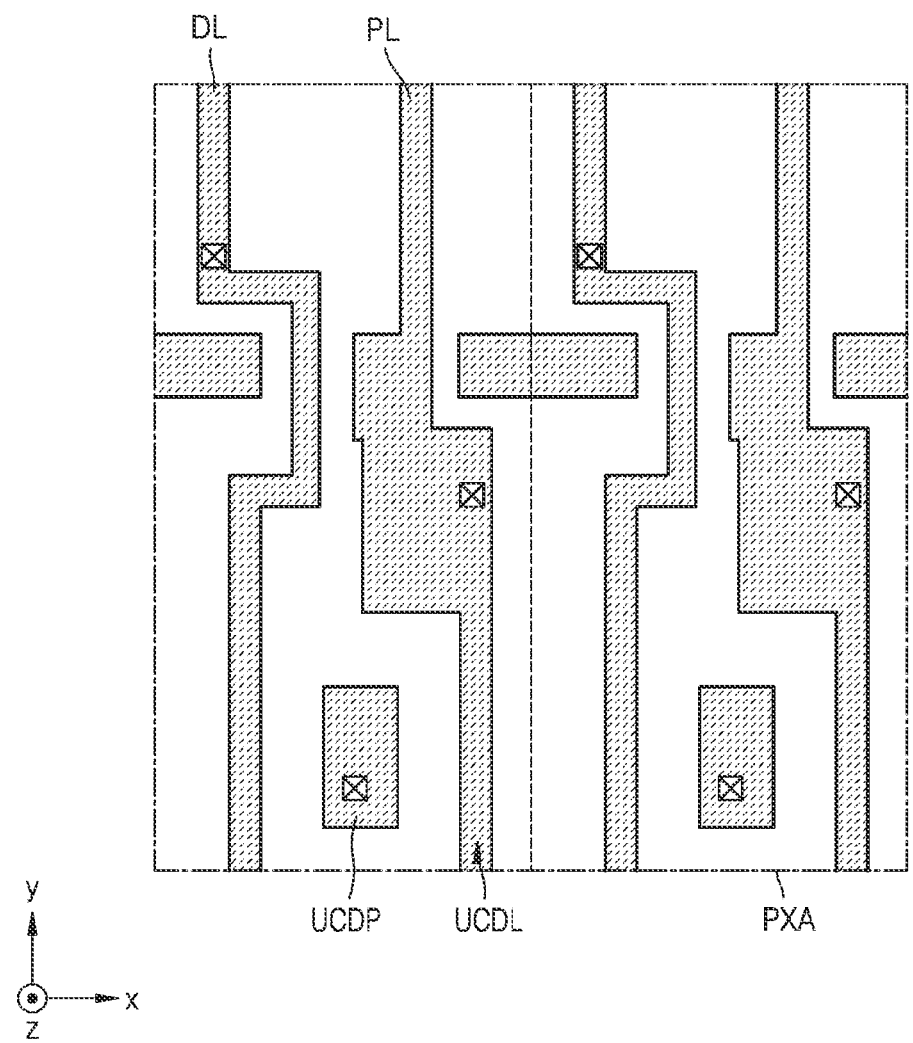

FIG. 5 is a plan view schematically illustrating a subpixel area PXA and a pixel circuit layer PCL of a display apparatus 1, according to an embodiment. Each of FIG. 6A, FIG. 6B, FIG. 6C, FIG. 6D, and FIG. 6E is a plan view illustrating components of the display apparatus 1 of FIG. 5 according to an embodiment. FIG. 6A is a plan view schematically illustrating a semiconductor layer Act. FIG. 6B is a plan view schematically illustrating a first gate conductive layer GL1. FIG. 6C is a plan view schematically illustrating a second gate conductive layer GL2. FIG. 6D is a plan view schematically illustrating a plurality of conductive patterns CDP and a plurality of inorganic insulating patterns IPT. FIG. 6E is a plan view schematically illustrating an upper conductive layer UCDL.

Referring to FIGS. 5 and 6A to 6E, the pixel circuit layer PCL may define or include a pixel circuit PC overlapping the subpixel area PXA. The pixel circuit PC may include at least one thin film transistor and at least one storage capacitor. For example, the pixel circuit PC may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, and a storage capacitor Cst.

The pixel circuit layer PCL may include a semiconductor layer Act, a first gate conductive layer GL1, a second gate conductive layer GL2, a plurality of inorganic insulating patterns IPT, a plurality of conductive patterns CDP, and an upper conductive layer UCDL. The semiconductor layer Act, the first gate conductive layer GL1, the second gate conductive layer GL2, the plurality of inorganic insulating patterns IPT, the plurality of conductive patterns CDP, and the upper conductive layer UCDL may overlap the subpixel area PXA.

The at least one thin film transistor may be arranged along the semiconductor layer Act. Some areas of the semiconductor layer Act may correspond to semiconductor areas of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, the semiconductor areas of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be connected to each other and may be bent in various shapes.

The semiconductor layer Act may include a channel area and a source area and a drain area on two (opposite) sides of the channel area. The source area and the drain area may be respectively the source electrode and the drain electrode of the thin film transistor.

The driving thin film transistor T1 may include a driving channel area A1, a driving source area S1 and a driving drain area D1 on two sides of the driving channel area A1, and a driving gate electrode G1 overlapping the driving channel area A1. The driving channel area A1 overlapping the driving gate electrode G1 may have a shape such as an omega shape to maintain a long channel length in a narrow space. When the driving channel area A1 is long, the driving range of a gate voltage may widen and thus the gradation of light emitted from a display element may be more finely controlled and the display quality may be improved.

The switching thin film transistor T2 may include a switching channel area A2, a switching source area S2 and a switching drain area D2 on two sides of the switching channel area A2, and a switching gate electrode G2 overlapping the switching channel area A2. The switching drain area D2 may be connected to the driving source area S1.

The compensation thin film transistor T3 may include a compensation channel area A3, a compensation source area S3 and a compensation drain area D3 on two sides of the compensation channel area A3, and a compensation gate electrode G3 overlapping the compensation channel area A3. In some embodiments, the compensation thin film transistor T3 may be a dual thin film transistor and may include compensation gate electrodes G3 overlapping two compensation channel areas A3. The compensation source area S3 may be connected to the driving drain area D1.

The first initialization thin film transistor T4 may include a first initialization channel area A4, a first initialization source area S4 and a first initialization drain area D4 on two sides of the first initialization channel area A4, and a first initialization gate electrode G4 overlapping the first initialization channel area A4. In some embodiments, the first initialization thin film transistor T4 may be a dual thin film transistor and may include first initialization gate electrodes G4 overlapping two first initialization channel areas A4. The first initialization source area S4 may be connected to the compensation drain area D3.

The operation control thin film transistor T5 may include an operation control channel area A5, an operation control source area S5 and an operation control drain area D5 located on two sides of the operation control channel area A5, and an operation control gate electrode G5 overlapping the operation control channel area A5. The operation control drain area D5 may be connected to the driving source area S1. The operation control drain area D5 may be connected to the switching drain area D2.

The emission control thin film transistor T6 may include an emission control channel area A6, an emission control source area S6 and an emission control drain area D6 located on two sides of the emission control channel area A6, and an emission control gate electrode G6 overlapping the emission control channel area A6. The emission control source area S6 may be connected to the driving drain area D1. The emission control source area S6 may be connected to the compensation source area S3.

The second initialization thin film transistor T7 may include a second initialization channel area A7, a second initialization source area S7 and a second initialization drain area D7 located on two sides of the second initialization channel area A7, and a second initialization gate electrode G7 overlapping the second initialization channel area A7. The second initialization drain area D7 may be connected to the first initialization drain area D4. The second initialization source area S7 may be connected to the emission control drain area D6.

A first gate conductive layer GL1 may be arranged over the semiconductor layer Act with at least one intervening insulating layer. The first gate conductive layer GL1 may include a scan line SL, a previous scan line SLp, an emission control line EL, and a driving gate electrode G1.

The scan line SL may extend in the first direction (e.g., the x direction or the −x direction). Some areas of the scan line SL may correspond to the switching gate electrode G2 and the compensation gate electrode G3. For example, an area of the scan line SL overlapping the switching channel area A2 may correspond to the switching gate electrode G2. Also, an area of the scan line SL overlapping the compensation channel area A3 may correspond to the compensation gate electrode G3.

The previous scan line SLp may extend in the first direction (e.g., the x direction or the −x direction). Some areas of the previous scan line SLp may correspond to the first initialization gate electrode G4 and the second initialization gate electrode G7. For example, an area of the previous scan line SLp overlapping the first initialization channel area A4 may be the first initialization gate electrode G4. Also, an area of the previous scan line SLp overlapping the second initialization channel area A7 may be the second initialization gate electrode G7.

The emission control line EL may extend in the first direction (e.g., the x direction or the −x direction). Some areas of the emission control line EL may be the operation control gate electrode G5 and the emission control gate electrode G6. For example, an area of the emission control line EL overlapping the operation control channel area A5 may be the operation control gate electrode G5. Also, an area of the emission control line EL overlapping the emission control channel area A6 may correspond to the emission control gate electrode G6.

The driving gate electrode G1 may be connected to the compensation thin film transistor T3 through a second conductive pattern CDP2.

In an embodiment, the scan line SL, the previous scan line SLp, the emission control line EL, and the driving gate electrode G1 may be arranged on the same layer and may include the same material.

The second gate conductive layer GL2 may be arranged over at least one insulating layer covering the first gate conductive layer GL1. The second gate conductive layer GL2 may include an initialization voltage line VL and a lower voltage line LPL.

In an embodiment, the initialization voltage line VL may be arranged or extend in the first direction (e.g., the x direction or the −x direction). The initialization voltage line VL may be connected to the first initialization thin film transistor T4 and the second initialization thin film transistor T7 through a fifth conductive pattern CDP5 described below. The initialization voltage line VL may have a constant voltage (e.g., −2 V).

The lower voltage line LPL may extend in the first direction (e.g., the x direction or the −x direction). The lower voltage line LPL may cover the driving gate electrode G1 and may constitute a storage capacitor Cst together with the driving gate electrode G1. That is, the storage capacitor Cst may include a first electrode CE1 and a second electrode CE2, the first electrode CE1 may be the driving gate electrode G1, and the second electrode CE2 may be a portion of the lower voltage line LPL. That is, the first electrode CE1 may be integrally formed with the driving gate electrode G1.

In an embodiment, the second electrode CE2 may include an opening CEOP having a closed curve shape or perimeter in a plan view. The opening CEOP may expose a center portion of the first electrode CE1.

The lower voltage line LPL may be electrically connected to the driving voltage line PL. The lower voltage line LPL and the driving voltage line PL may be connected through a fourth conductive pattern CDP4. Thus, the second electrode CE2 may have the same voltage level (constant voltage) as the driving voltage line PL. For example, the lower voltage line LPL may have a constant voltage of +5 V. The driving voltage line PL and the lower voltage line LPL may supply a first power voltage ELVDD to the pixel circuit PC in a mesh structure.

In an embodiment, the lower voltage line LPL may be arranged on a different layer than the driving voltage line PL, and the specific resistance of the lower voltage line LPL may be greater than the specific resistance of the driving voltage line PL.

The lower voltage line LPL and the initialization voltage line VL may be arranged on the same layer and may include the same material.

A plurality of inorganic insulating patterns IPT may be arranged over the second gate conductive layer GL2, and a plurality of conductive patterns CDP may be arranged over the plurality of inorganic insulating patterns IPT.

The plurality of inorganic insulating patterns IPT may be arranged in the subpixel area PXA. In other words, the plurality of inorganic insulating patterns IPT may overlap the subpixel area PXA. The plurality of inorganic insulating patterns IPT may overlap one subpixel area PXA. The plurality of inorganic insulating patterns IPT may be spaced apart from each other. In an embodiment, the plurality of inorganic insulating patterns IPT may be spaced apart from each other in the subpixel area PXA.

A first (conductive) line may overlap one of the plurality of inorganic insulating patterns IPT, and a second (conductive) line may overlap another one of the plurality of inorganic insulating patterns IPT. The first line and the second line may overlap the subpixel area PXA, may be parallel to each other, and may extend in the first direction (e.g., the x direction or the −x direction). For example, the first line may be the scan line SL, and the second line may be the emission control line EL. As another example, the first line may be the previous scan line SLp, and the second line may be the emission control line EL. As another example, the first line may be the initialization voltage line VL, and the second line may be the emission control line EL.

The plurality of conductive patterns CDP may be respectively arranged over the plurality of inorganic insulating patterns IPT. In an embodiment, the plurality of conductive patterns CDP may be arranged over or overlap one of the plurality of inorganic insulating patterns IPT. In other words, the plurality of conductive patterns CDP may be arranged over one inorganic insulating pattern IPT. In other embodiments, the plurality of conductive patterns CDP may be respectively arranged over or overlap the plurality of inorganic insulating patterns IPT.

In an embodiment, the plurality of conductive patterns CDP may include a first conductive pattern CDP1, a second conductive pattern CDP2, a third conductive pattern CDP3, a fourth conductive pattern CDP4, a fifth conductive pattern CDP5, and a sixth conductive pattern CDP6. In an embodiment, the first conductive pattern CDP1, the second conductive pattern CDP2, the fourth conductive pattern CDP4, and the fifth conductive pattern CDP5 may be arranged over or overlap one of the plurality of inorganic insulating patterns IPT. The third conductive pattern CDP3 and the sixth conductive pattern CDP6 may be arranged over or overlap another one of the plurality of inorganic insulating patterns IPT.

The first conductive pattern CDP1 may electrically connect the switching source area S2 to the data line DL. The second conductive pattern CDP2 may electrically connect the driving gate electrode G1 to the compensation drain area D3. In an embodiment, the second conductive pattern CDP2 may electrically connect the driving gate electrode G1 to the compensation drain area D3 through the opening CEOP of the second electrode CE2. The third conductive pattern CDP3 may electrically connect the lower voltage line LPL to the operation control source area S5. The fourth conductive pattern CDP4 may electrically connect the lower voltage line LPL to the driving voltage line PL. The fifth conductive pattern CDP5 may electrically connect the initialization voltage line VL to the first initialization drain area D4 and may electrically connect the initialization voltage line VL to the second initialization drain area D7. The sixth conductive pattern CDP6 may electrically connect the emission control drain area D6 to an upper conductive pattern UCDP.

In an embodiment, the plurality of conductive patterns CDP may be arranged directly on the same insulating layer and may include the same material.

The upper conductive layer UCDL may be arranged over or overlap at least one insulating layer covering the plurality of conductive patterns CDP and the plurality of inorganic insulating patterns IPT. The upper conductive layer UCDL may include a driving voltage line PL, a data line DL, and an upper conductive pattern UCDP. In an embodiment, at least one of the driving voltage line PL and the data line DL may be a third (conductive) line overlapping the subpixel area PXA, intersecting the first line and/or the second line, and extending in the second direction (e.g., the y direction or the −y direction).

The driving voltage line PL may extend in the second direction (e.g., the y direction or the −y direction) intersecting with the first direction (e.g., the x direction or the −x direction). In an embodiment, the driving voltage line PL may extend substantially in the second direction (e.g., the y direction or the −y direction). The driving voltage line PL may be electrically connected to the lower voltage line LPL through the fourth conductive pattern CDP4.

The data line DL may extend in the second direction (e.g., they direction or the −y direction). The data line DL may be electrically connected to the switching source area S2 through the first conductive pattern CDP1. A portion of the data line DL may be the switching source electrode.

The upper conductive pattern UCDP may be electrically connected to the sixth conductive pattern CDP6. Although not illustrated, the upper conductive pattern UCDP may be electrically connected to an organic light emitting diode as a display element.

In an embodiment, the driving voltage line PL, the data line DL, and the upper conductive pattern UCDP may be arranged directly on the same insulating layer and may include the same material.

The pixel circuit layer PCL may include a plurality of inorganic insulating patterns IPT spaced apart from each other and may include a first line and a second line extending in the first direction (e.g., the x direction or the −x direction) and a third line extending in the second direction (e.g., the y direction or the −y direction). In other words, the display apparatus 1 may include the plurality of inorganic insulating patterns IPT and simultaneously the lines may be variously arranged in the first direction (e.g., the x direction or the −x direction) and/or the second direction (e.g., the y direction or the −y direction) without disconnection. Thus, because the display apparatus 1 according to an embodiment includes the plurality of inorganic insulating patterns IPT spaced apart from each other, defects potentially caused by an external impact may be prevented or reduced and the lines may be variously arranged in the pixel circuit layer PCL.

Figure 7:
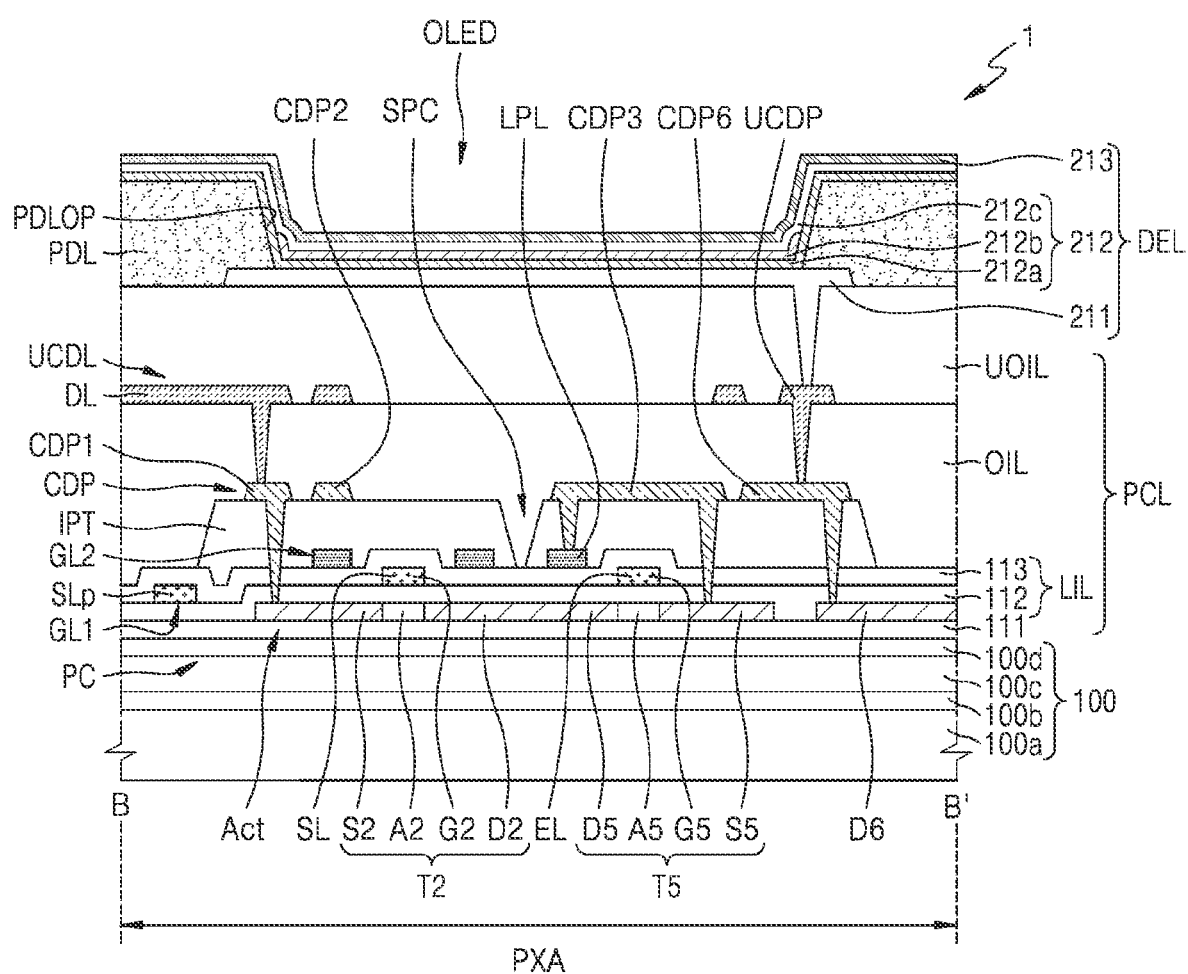
FIG. 7 is a cross-sectional view schematically illustrating the display apparatus of FIG. 5 taken along line B-B' according to an embodiment.

FIG. 7 is a cross-sectional view schematically illustrating the display apparatus 1 of FIG. 5 taken along line B-B' according to an embodiment. In FIG. 7, like reference numerals as those in FIGS. 3B and 5 will denote like members, and thus redundant descriptions thereof will be omitted for conciseness.

Referring to FIG. 7, the display apparatus 1 may include a substrate 100, a pixel circuit layer PCL, and a display element layer DEL. The pixel circuit layer PCL may define a pixel circuit PC. In other words, the pixel circuit layer PCL may include a pixel circuit PC. The display element layer DEL may include an organic light emitting diode OLED as a display element.

The substrate 100 may include a subpixel area PXA. In an embodiment, the substrate 100 may include a plurality of subpixel areas PXA. In an embodiment, one pixel circuit PC may be arranged in the subpixel area PXA. In an embodiment, one organic light emitting diode OLED may be arranged in the subpixel area PXA.

The pixel circuit layer PCL defining the pixel circuit PC may be arranged over the substrate 100. The pixel circuit PC may overlap the subpixel area PXA. The pixel circuit layer PCL may include a buffer layer 111, a semiconductor layer Act, a lower inorganic insulating layer LIL, a first gate conductive layer GL1, a second gate conductive layer GL2, a plurality of inorganic insulating patterns IPT, a plurality of conductive patterns CDP, an organic insulating layer OIL, an upper conductive pattern UCDP, and an upper organic insulating layer UOIL.

The semiconductor layer Act may be arranged over or overlap the buffer layer 111. In an embodiment, the semiconductor layer Act may include a switching channel area A2, a switching source area S2, a switching drain area D2, an operation control channel area A5, an operation control source area S5, an operation control drain area D5, and an emission control drain area D6.

The lower inorganic insulating layer LIL may be arranged over or overlap the substrate 100. In an embodiment, the lower inorganic insulating layer LIL may be arranged between the substrate 100 and the plurality of inorganic insulating patterns IPT. In an embodiment, the lower inorganic insulating layer LIL may be continuously arranged over the substrate 100. In an embodiment, the lower inorganic insulating layer LIL may include a groove. The lower inorganic insulating layer LIL may include a first gate insulating layer 112 and a second gate insulating layer 113 that are sequentially arranged over the substrate 100. The first gate insulating layer 112 may cover the semiconductor layer Act. In other words, the semiconductor layer Act may be arranged between the substrate 100 and the first gate insulating layer 112.

The first gate conductive layer GL1 may be arranged over or overlap the first gate insulating layer 112. In an embodiment, the first gate conductive layer GL1 may be arranged between the first gate insulating layer 112 and the second gate insulating layer 113. In an embodiment, the first gate conductive layer GL1 may include a scan line SL, a previous scan line SLp, and an emission control line EL. The scan line SL may extend in the first direction (e.g., the x direction or the −x direction in FIG. 5). In an embodiment, one area of the scan line SL may be the switching gate electrode G2. The previous scan line SLp may extend in the first direction (e.g., the x direction or the −x direction in FIG. 5). The emission control line EL may extend in the first direction (e.g., the x direction or the −x direction in FIG. 5). In an embodiment, one area of the emission control line EL may be the operation control gate electrode G5. The second gate insulating layer 113 may cover the first gate conductive layer GL1.

The scan line SL configured to transmit a scan signal may be a first line and may overlap one of the plurality of inorganic insulating patterns IPT, and the emission control line EL configured to transmit an emission control signal may be a second line and may overlap another one of the plurality of inorganic insulating patterns IPT.

The second gate conductive layer GL2 may be arranged over or overlap the second gate insulating layer 113. In an embodiment, the second gate conductive layer GL2 may include a lower voltage line LPL.

The plurality of inorganic insulating patterns IPT may be arranged in the subpixel area PXA. In other words, the plurality of inorganic insulating patterns IPT may overlap the subpixel area PXA. That is, the plurality of inorganic insulating patterns IPT may overlap one subpixel area PXA.

The plurality of inorganic insulating patterns IPT may be arranged over the lower inorganic insulating layer LIL. In an embodiment, the plurality of inorganic insulating patterns IPT may be arranged over or overlap the second gate insulating layer 113 and/or the first gate insulating layer 112. The plurality of inorganic insulating patterns IPT may be arranged over or overlap the first line and the second line. In an embodiment, the plurality of inorganic insulating patterns IPT may be arranged over or overlap the scan line SL and the emission control line EL.

The plurality of inorganic insulating patterns IPT may be spaced apart from each other in a direction parallel to the substrate 100. In an embodiment, the plurality of inorganic insulating patterns IPT may be spaced apart from each other in the subpixel area PXA. A space SPC may be defined between the plurality of inorganic insulating patterns IPT adjacent to each other. The space SPC may be arranged in the subpixel area PXA and may overlap the organic light emitting diode OLED as a display element. In some embodiments, when the lower inorganic insulating layer LIL includes a groove, the groove may overlap the space SPC between the plurality of inorganic insulating patterns IPT adjacent to each other.

The plurality of conductive patterns CDP may be arranged over or overlap the plurality of inorganic insulating patterns IPT. In an embodiment, the plurality of conductive patterns CDP may include a first conductive pattern CDP1, a second conductive pattern CDP2, a third conductive pattern CDP3, and a sixth conductive pattern CDP6.

In an embodiment, the plurality of conductive patterns CDP may be arranged over or overlap a same one of the plurality of inorganic insulating patterns IPT. For example, the first conductive pattern CDP1 and the second conductive pattern CDP2 may be arranged over or overlap one of the plurality of inorganic insulating patterns IPT. The third conductive pattern CDP3 and the sixth conductive pattern CDP6 may be arranged over or overlap another one of the plurality of inorganic insulating patterns IPT. In other embodiments, the plurality of conductive patterns CDP may be respectively arranged over or overlap the plurality of inorganic insulating patterns IPT.

The first conductive pattern CDP1 may be electrically connected to the switching source area S2 of the semiconductor layer Act through a contact hole of one of the plurality of inorganic insulating patterns IPT and the lower inorganic insulating layer LIL. The third conductive pattern CDP3 may be electrically connected to the lower voltage line LPL through a contact hole of another one of the plurality of inorganic insulating patterns IPT. The third conductive pattern CDP3 may be electrically connected to the operation control source area S5 of the semiconductor layer Act through a contact hole of one of the plurality of inorganic insulating patterns IPT and the lower inorganic insulating layer LIL. The sixth conductive pattern CDP6 may be electrically connected to the emission control drain area D6 of the semiconductor layer Act through a contact hole of one of the plurality of inorganic insulating patterns IPT and the lower inorganic insulating layer LIL.

The organic insulating layer OIL may cover the plurality of inorganic insulating patterns IPT. The organic insulating layer OIL may fill the space SPC defined between the plurality of inorganic insulating patterns IPT adjacent to each other. A portion of the organic insulating layer OIL may be arranged inside the space SPC. The organic insulating layer OIL may cover the plurality of conductive patterns CDP. In an embodiment, the plurality of conductive patterns CDP may be arranged between the plurality of inorganic insulating patterns IPT and the organic insulating layer OIL.

The upper conductive layer UCDL may be arranged over or overlap the organic insulating layer OIL. The upper conductive layer UCDL may include a data line DL and an upper conductive pattern UCDP. The data line DL may extend in the second direction (e.g., the y direction or the −y direction in FIG. 5). The data line DL may be electrically connected to the first conductive pattern CDP1 through a contact hole of the organic insulating layer OIL. The upper conductive pattern UCDP may be electrically connected to the sixth conductive pattern CDP6 through a contact hole of the organic insulating layer OIL.

The upper organic insulating layer UOIL may cover the upper conductive layer UCDL.

The display element layer DEL may be arranged over or overlap the pixel circuit layer PCL. The display element layer DEL may include an organic light emitting diode OLED as a display element electrically connected to the pixel circuit PC. The organic light emitting diode OLED may include a pixel electrode 211, an intermediate layer 212, and an opposite electrode 213. The pixel electrode 211 may be electrically connected to the upper conductive pattern UCDP through a contact hole of the upper organic insulating layer UOIL.

Figure 8:
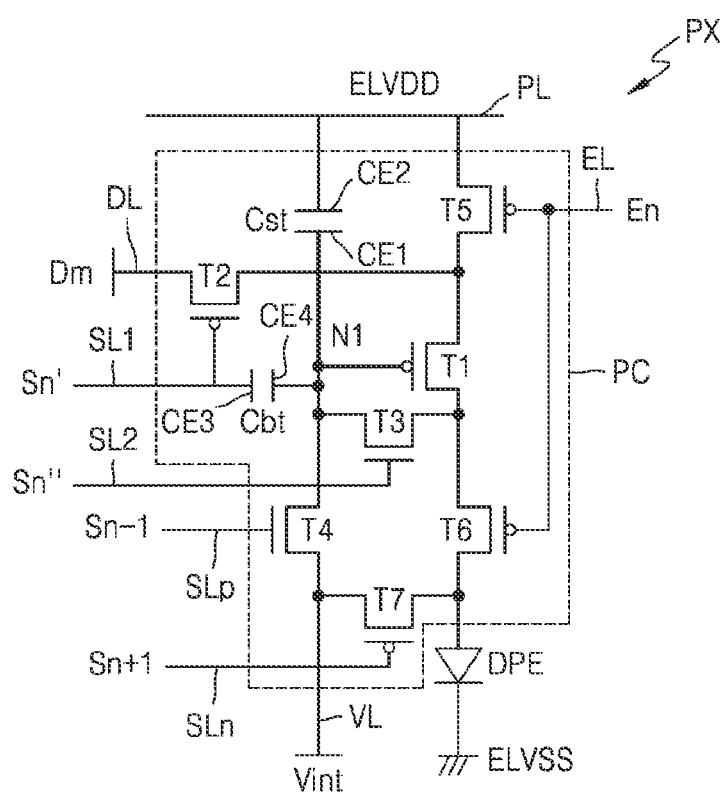
FIG. 8 is an equivalent circuit diagram of a subpixel included in a display apparatus, according to an embodiment.

FIG. 8 is an equivalent circuit diagram of a subpixel PX included in a display apparatus, according to an embodiment.

Referring to FIG. 8, a pixel circuit PC may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, a storage capacitor Cst, and a boost capacitor Cbt.

FIG. 8 illustrates a case where signal lines SL1, SL2, SLp, SLn, EL, and DL, an initialization voltage line VL, and a driving voltage line PL are provided for each pixel circuit PC; however, in other embodiments, at least one of the signal lines SL1, SL2, SLp, SLn, EL, and DL and/or the initialization voltage line VL may be shared by adjacent pixel circuits.

Some of a plurality of thin film transistors T1, T2, T3, T4, T5, T6, and T7 may be n-channel MOSFETs (NMOSs), and the others may be a p-channel MOSFETs (PMOSs).

In an embodiment, among the plurality of thin film transistors T1, T2, T3, T4, T5, T6, and T7, each of the compensation thin film transistor T3 and the first initialization thin film transistor T4 may be an NMOS, and each of the others may be a PMOS.

In other embodiments, among the plurality of thin film transistors T1, T2, T3, T4, T5, T6, and T7, each of the compensation thin film transistor T3, the first initialization thin film transistor T4, and the second initialization thin film transistor T7 may be an NMOS and each of the others may be a PMOS. Alternatively, only one of the plurality of thin film transistors T1, T2, T3, T4, T5, T6, and T7 may be an NMOS and each of the others may be a PMOS. Alternatively, each of the plurality of thin film transistors T1, T2, T3, T4, T5, T6, and T7 may be an NMOS.

The signal lines may include a first scan line SL1 configured to transmit a first scan signal Sn', a second scan line SL2 configured to transmit a second scan signal Sn", a previous scan line SLp configured to transmit a previous scan signal Sn−1 to the first initialization thin film transistor T4, an emission control line EL configured to transmit an emission control signal En to the operation control thin film transistor T5 and the emission control thin film transistor T6, a next scan line SLn configured to transmit a next scan signal Sn+1 to the second initialization thin film transistor T7, and a data line DL configured to transmit a data signal Dm.

The driving voltage line PL may transmit a first power voltage ELVDD to the driving thin film transistor T1, and the initialization voltage line VL may transmit an initialization voltage Vint for initializing the driving thin film transistor T1 and a pixel electrode of the display element DPE.

The driving gate electrode of the driving thin film transistor T1 may be electrically connected to a first electrode CE1 of the storage capacitor Cst, the driving source electrode of the driving thin film transistor T1 may be electrically connected to the driving voltage line PL via the operation control thin film transistor T5, and the driving drain electrode of the driving thin film transistor T1 may be electrically connected to the pixel electrode of a display element DPE via the emission control thin film transistor T6. The driving thin film transistor T1 may receive the data signal Dm according to a switching operation of the switching thin film transistor T2 and supply a driving current to the display element DPE.

The switching gate electrode of the switching thin film transistor T2 may be electrically connected to the first scan line SL1. The switching source electrode of the switching thin film transistor T2 may be electrically connected to the data line DL. The switching drain electrode of the switching thin film transistor T2 may be electrically connected to the driving source electrode of the driving thin film transistor T1 and may be electrically connected to the driving voltage line PL via the operation control thin film transistor T5. The switching thin film transistor T2 may be turned on according to the first scan signal Sn' received through the first scan line SL1, to perform a switching operation of transmitting the data signal Dm transmitted to the data line DL to the driving source electrode of the driving thin film transistor T1.

The compensation gate electrode of the compensation thin film transistor T3 may be electrically connected to the second scan line SL2. The compensation drain electrode of the compensation thin film transistor T3 may be electrically connected to the driving drain electrode of the driving thin film transistor T1 and may be electrically connected to the pixel electrode of the display element DPE via the emission control thin film transistor T6. The compensation source electrode of the compensation thin film transistor T3 may be electrically connected to the first electrode CE1 of the storage capacitor Cst and the driving gate electrode of the driving thin film transistor T1. The compensation source electrode of the compensation thin film transistor T3 may be electrically connected to the first initialization drain electrode of the first initialization thin film transistor T4.

The compensation thin film transistor T3 may be turned on according to the second scan signal Sn" received through the second scan line SL2, to electrically connect the driving gate electrode and the driving drain electrode of the driving thin film transistor T1 to diode-connect the driving thin film transistor T1.

The first initialization gate electrode of the first initialization thin film transistor T4 may be electrically connected to the previous scan line SLp. The first initialization drain electrode of the first initialization thin film transistor T4 may be electrically connected to the second initialization source electrode of the second initialization thin film transistor T7 and the initialization voltage line VL. The first initialization drain electrode of the first initialization thin film transistor T4 may be electrically connected to the first electrode CE1 of the storage capacitor Cst, the compensation source electrode of the compensation thin film transistor T3, and the driving gate electrode of the driving thin film transistor T1. The first initialization thin film transistor T4 may be turned on according to the previous scan signal Sn−1 received through the previous scan line SLp, to perform an initialization operation of initializing the voltage of the driving gate electrode of the driving thin film transistor T1 by transmitting the initialization voltage Vint to the driving gate electrode of the driving thin film transistor T1.

The operation control gate electrode of the operation control thin film transistor T5 may be electrically connected to the emission control line EL. The operation control source electrode of the operation control thin film transistor T5 may be electrically connected to the driving voltage line PL. The operation control drain electrode of the operation control thin film transistor T5 may be electrically connected to the driving source electrode of the driving thin film transistor T1 and the switching drain electrode of the switching thin film transistor T2.

The emission control gate electrode of the emission control thin film transistor T6 may be electrically connected to the emission control line EL. The emission control source electrode of the emission control thin film transistor T6 may be connected to the driving drain electrode of the driving thin film transistor T1 and the compensation drain electrode of the compensation thin film transistor T3. The emission control drain electrode of the emission control thin film transistor T6 may be electrically connected to the second initialization source electrode of the second initialization thin film transistor T7 and the pixel electrode of the display element DPE.

The operation control thin film transistor T5 and the emission control thin film transistor T6 may be simultaneously turned on according to the emission control signal En received through the emission control line EL, such that the first power voltage ELVDD may be transmitted to the display element DPE and thus a driving current may flow through the display element DPE.

The second initialization gate electrode of the second initialization thin film transistor T7 may be electrically connected to the next scan line SLn. The second initialization source electrode of the second initialization thin film transistor T7 may be electrically connected to the emission control drain electrode of the emission control thin film transistor T6 and the pixel electrode of the display element DPE. The second initialization drain electrode of the second initialization thin film transistor T7 may be electrically connected to the first initialization source electrode of the first initialization thin film transistor T4 and the initialization voltage line VL. The second initialization thin film transistor T7 may be turned on according to the next scan signal Sn+1 received through the next scan line SLn, to initialize the pixel electrode of the display element DPE.

The second initialization thin film transistor T7 may be connected to the next scan line SLn as illustrated in FIG. 8. In other embodiments, the second initialization thin film transistor T7 may be connected to the emission control line EL and driven according to the emission control signal En. Moreover, the positions of source electrodes and drain electrodes of FIG. 8 may be interchanged depending on the types (p-type or n-type) of transistors.

The storage capacitor Cst may include a first electrode CE1 and a second electrode CE2. The first electrode CE1 of the storage capacitor Cst may be electrically connected to the driving gate electrode of the driving thin film transistor T1, and the second electrode CE2 of the storage capacitor Cst may be electrically connected to the driving voltage line PL. The storage capacitor Cst may store the charge corresponding to the difference between the first power voltage ELVDD and the driving gate electrode voltage of the driving thin film transistor T1.

The boost capacitor Cbt may include a third electrode CE3 and a fourth electrode CE4. The third electrode CE3 may be electrically connected to the switching gate electrode of the switching thin film transistor T2 and the first scan line SL1, and the fourth electrode CE4 may be electrically connected to the compensation source electrode of the compensation thin film transistor T3 and a node connection line. The boost capacitor Cbt may increase the voltage of a first node N1 when the first scan signal Sn' supplied to the first scan line SL1 is turned off. As such, when the voltage of the first node N1 is increased, the black gradation may be clearly expressed.

The first node N1 may be an area to which the driving gate electrode of the driving thin film transistor T1, the compensation source electrode of the compensation thin film transistor T3, the compensation drain electrode of the first initialization thin film transistor T4, and the fourth electrode CE4 of the boost capacitor Cbt are electrically connected by the node connection line.

In the present embodiment, at least one of the plurality of thin film transistors T1, T2, T3, T4, T5, T6, and T7 may include a semiconductor layer including oxide and each of the others may include a semiconductor layer including silicon.

Particularly, the driving thin film transistor directly affecting the brightness of the display apparatus may include a semiconductor layer including polycrystalline silicon having high reliability, such that a high-resolution display apparatus may be implemented.

Because an oxide semiconductor may have high carrier mobility and a low leakage current, a voltage drop may not be significant even when a driving time is long. Advantageously, the performance of the display apparatus may be satisfactory during low-frequency driving because undesirable color change of an image may not be significant.

As such, because an oxide semiconductor may have a small leakage current, at least one of the compensation thin film transistor T3, the first initialization thin film transistor T4, and the second initialization thin film transistor T7 connected to the driving gate electrode of the driving thin film transistor T1 may include an oxide semiconductor to reduce power consumption while preventing a leakage current that may flow to the driving gate electrode.

Figure 9:
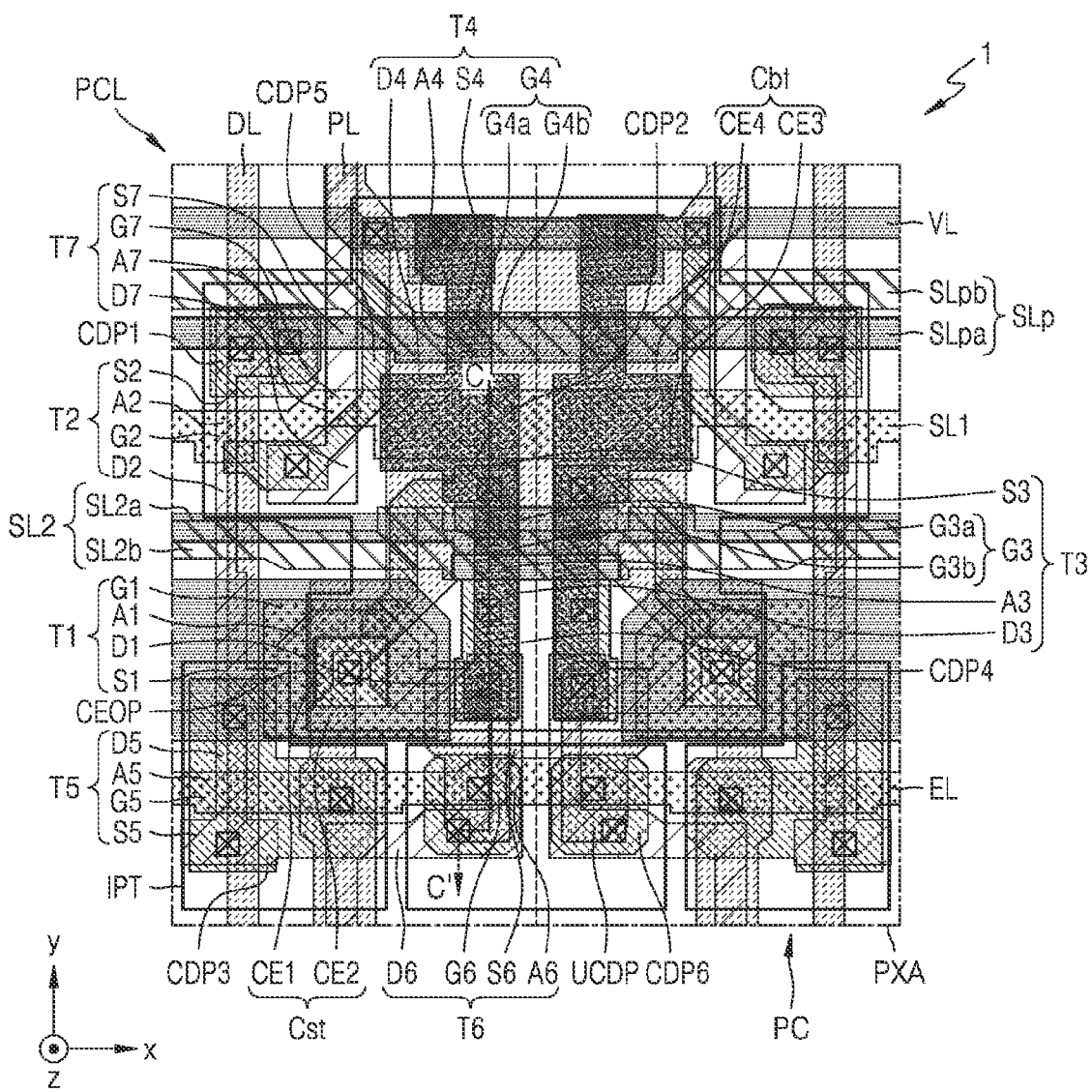
FIG. 9 is a plan view schematically illustrating a subpixel area and a pixel circuit layer of a display apparatus, according to an embodiment.
Figure 10A:
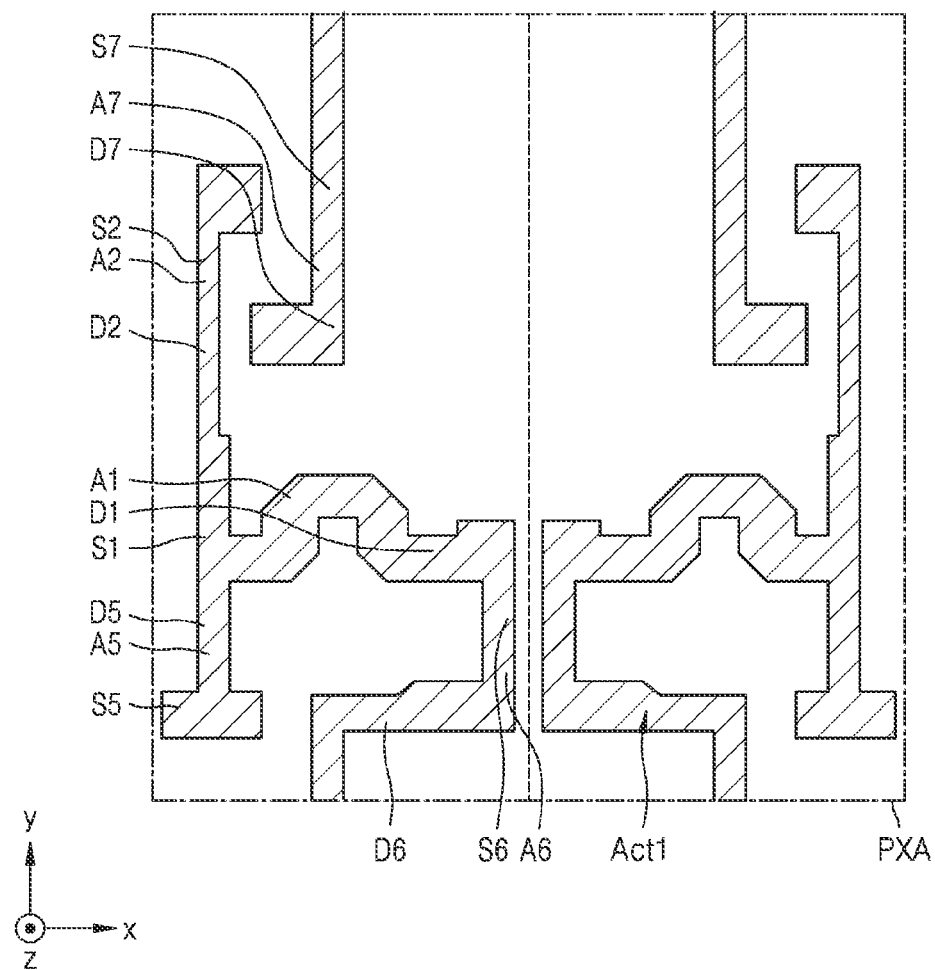
FIG. 10G is a plan view illustrating components of the display apparatus of FIG. 9 according to an embodiment.
Figure 10B:
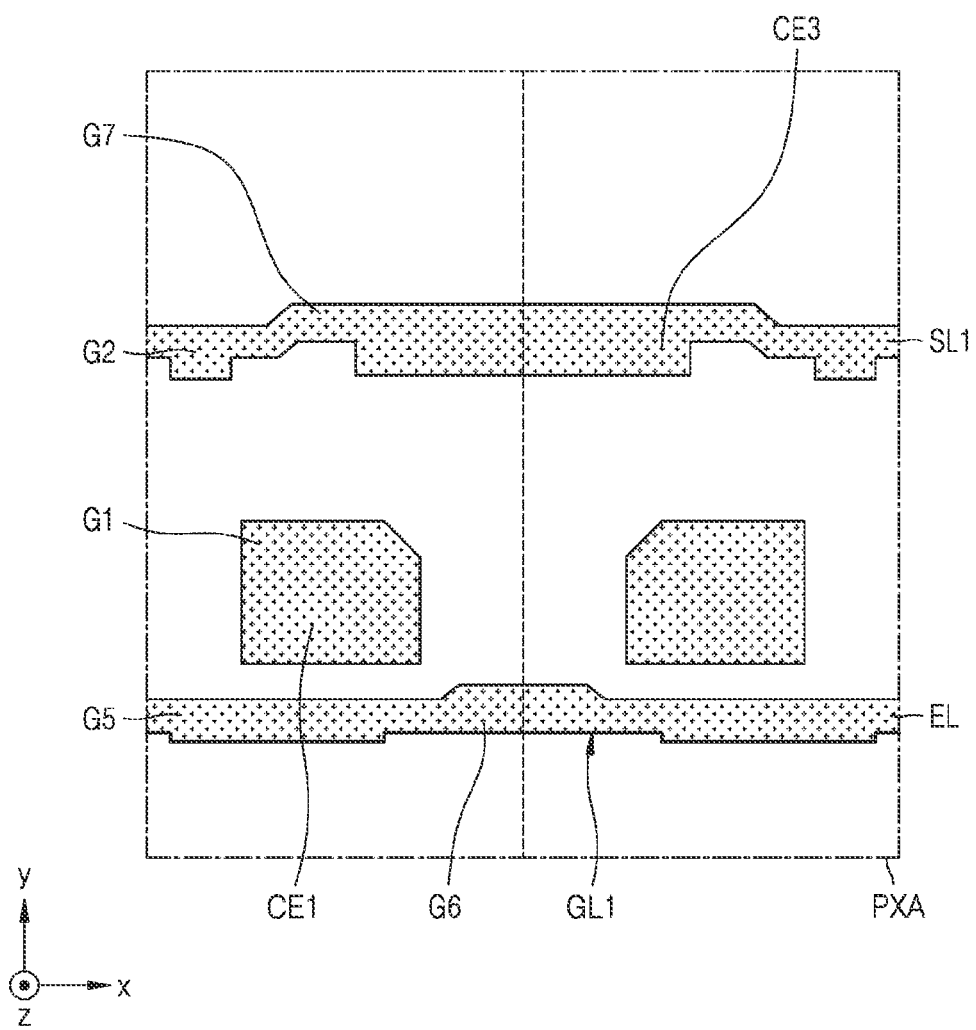
Figure 10C:
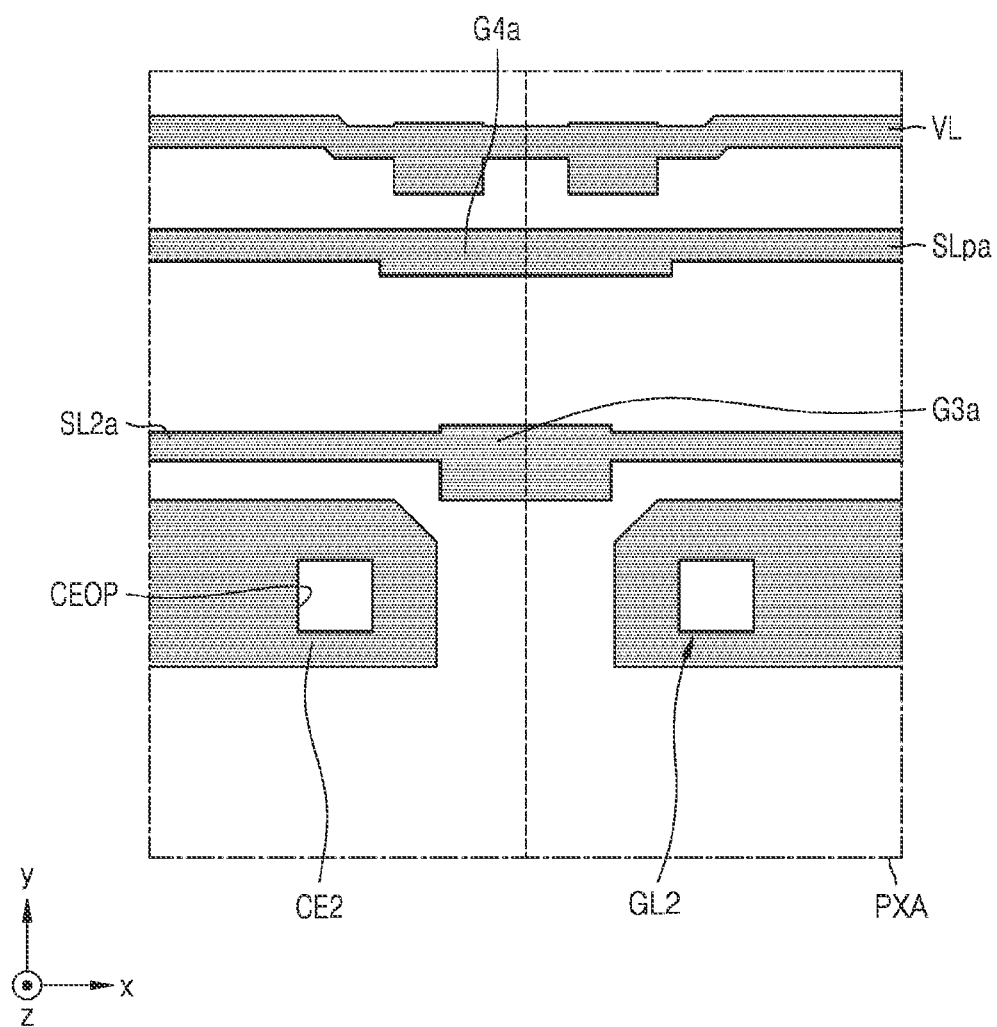
Figure 10D:
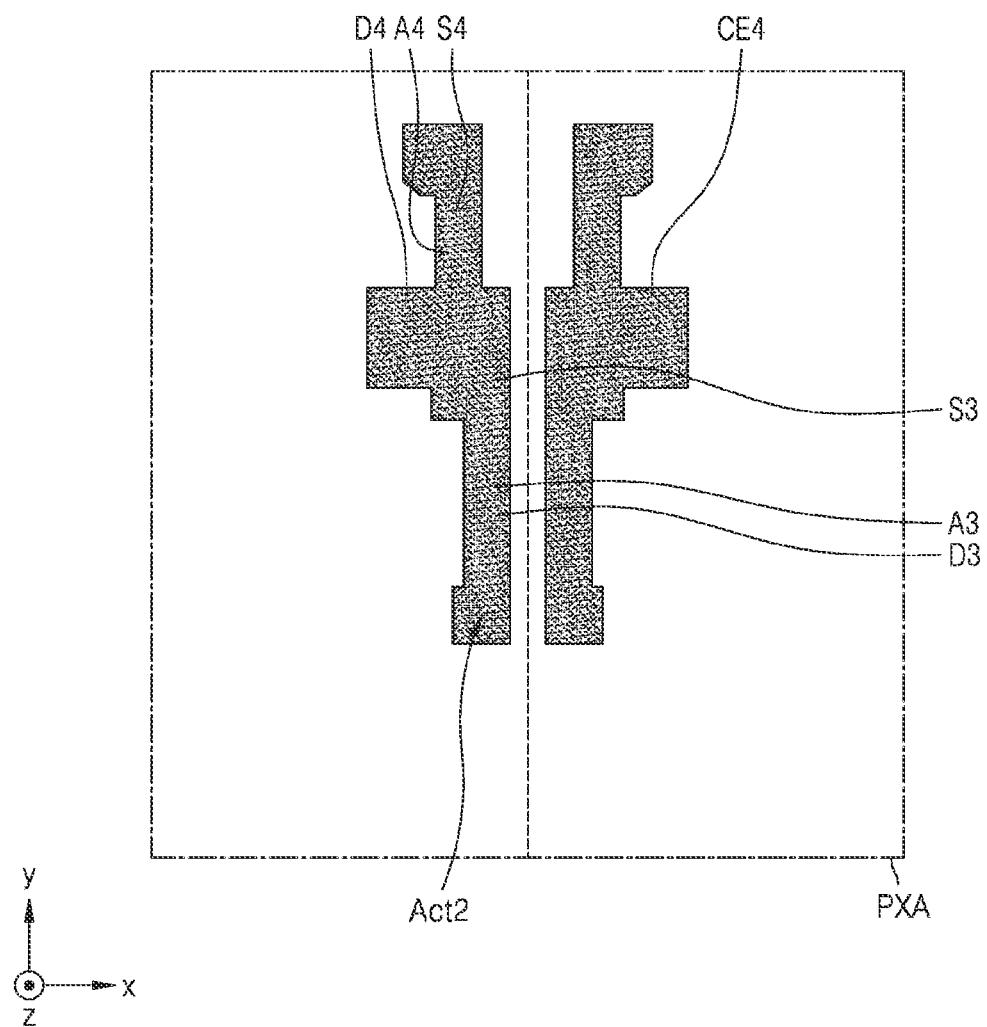
Figure 10E:
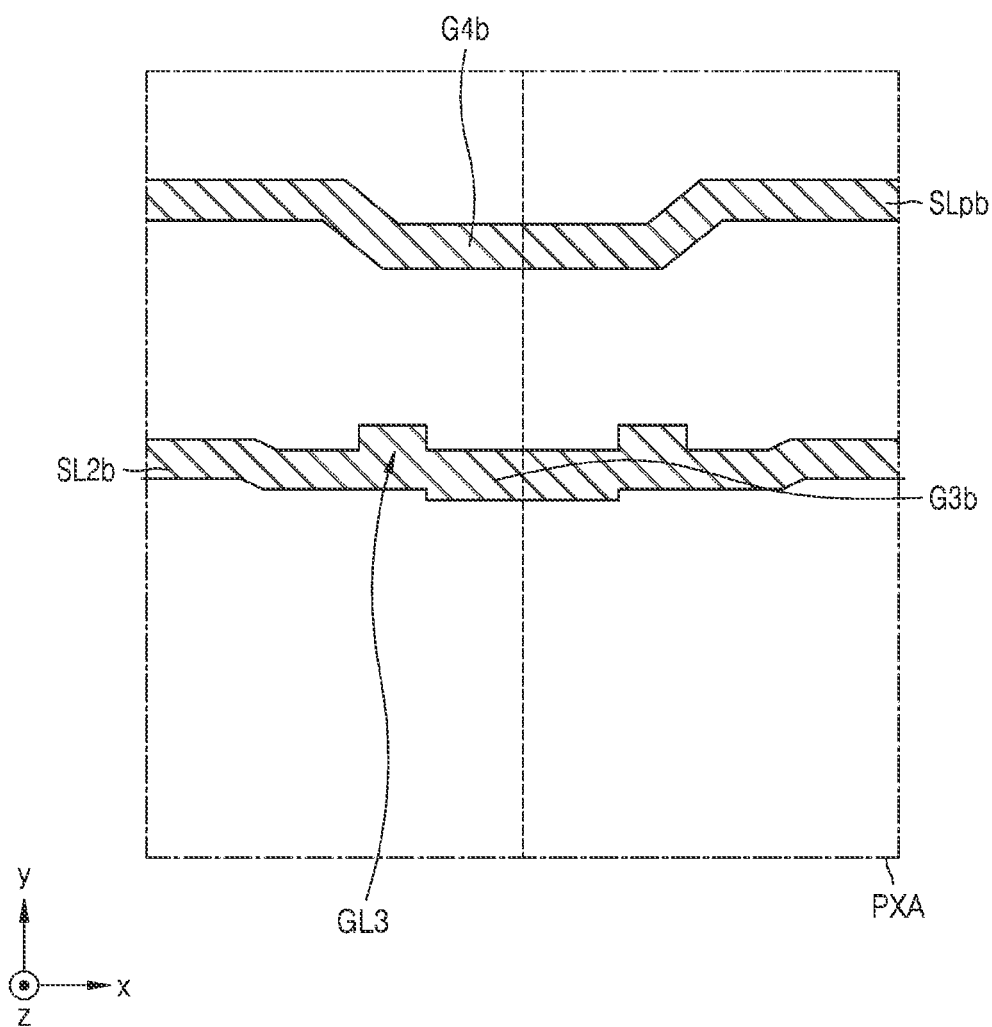
Figure 10F:
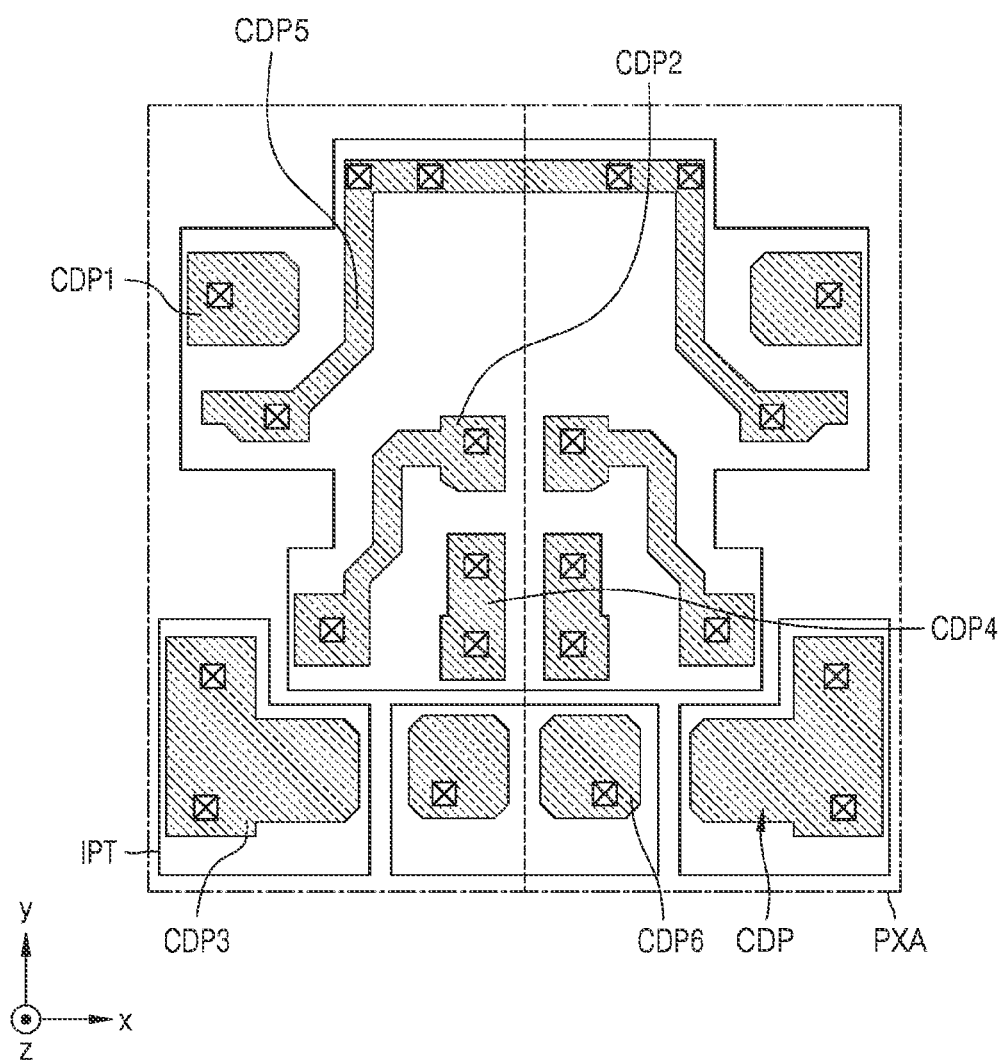
Figure 10G:
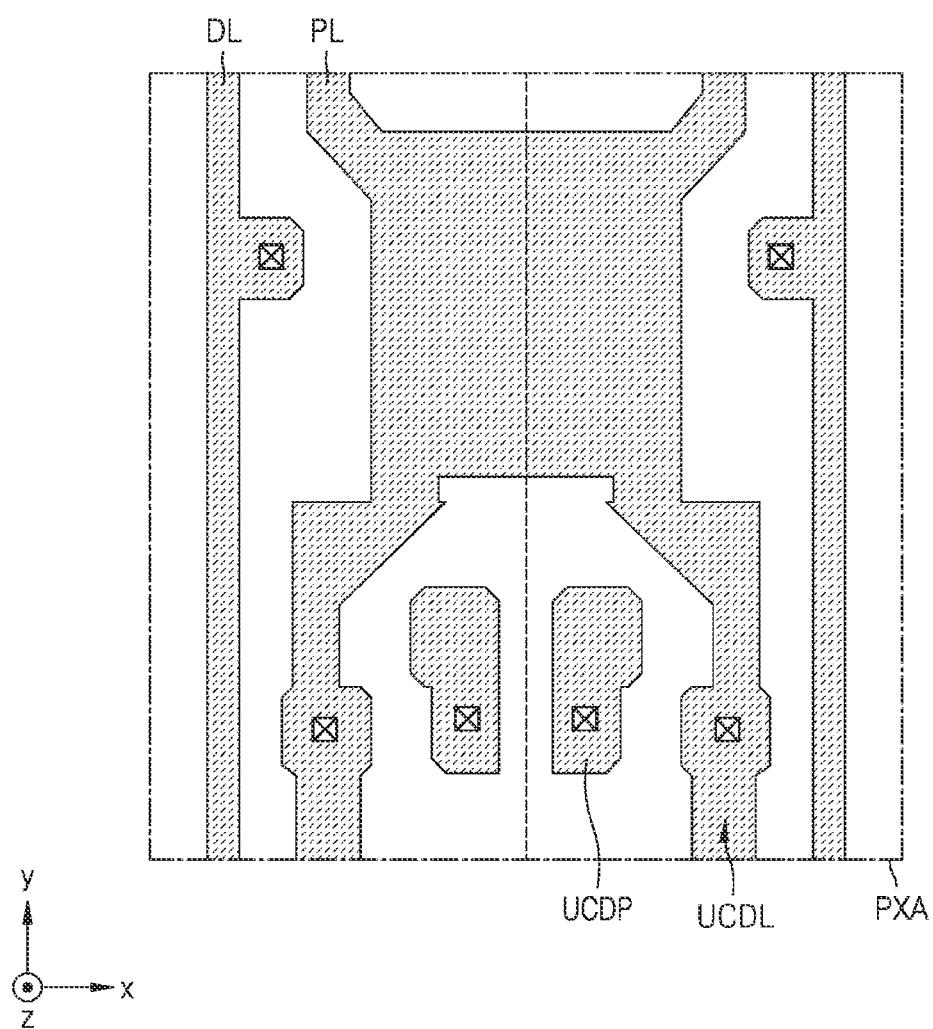

FIG. 9 is a plan view schematically illustrating a subpixel area PXA and a pixel circuit layer PCL of a display apparatus 1, according to an embodiment. Each of FIG. 10A, FIG. 10B, FIG. 10C, FIG. 10D, FIG. 10E, FIG. 10F, and FIG. 10G is a plan view illustrating components of the display apparatus of FIG. 9. FIG. 10A is a plan view schematically illustrating a first semiconductor layer Act1. FIG. 10B is a plan view schematically illustrating a first gate conductive layer GL1. FIG. 10C is a plan view schematically illustrating a second gate conductive layer GL2. FIG. 10D is a plan view schematically illustrating a second semiconductor layer Act2. FIG. 10E is a plan view schematically illustrating a third gate conductive layer GL3. FIG. 10F is a plan view schematically illustrating a plurality of conductive patterns CDP and a plurality of inorganic insulating patterns IPT. FIG. 10G is a plan view schematically illustrating an upper conductive layer UCDL.

Referring to FIGS. 9 and 10A to 10G, the pixel circuit layer PCL may define a pixel circuit PC overlapping the subpixel area PXA. The pixel circuit PC may include at least one thin film transistor. In an embodiment, the pixel circuit PC may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, a storage capacitor Cst, and a boost capacitor Cbt.

The pixel circuit layer PCL may include a first semiconductor layer Act1, a first gate conductive layer GL1, a second gate conductive layer GL2, a second semiconductor layer Act2, a third gate conductive layer GL3, a plurality of inorganic insulating patterns IPT, a plurality of conductive patterns CDP, and an upper conductive layer UCDL. The first semiconductor layer Act1, the first gate conductive layer GL1, the second gate conductive layer GL2, the second semiconductor layer Act2, the third gate conductive layer GL3, the plurality of inorganic insulating patterns IPT, the plurality of conductive patterns CDP, and the upper conductive layer UCDL may overlap the subpixel area PXA.

In an embodiment, each of the driving thin film transistor T1, the switching thin film transistor T2, the operation control thin film transistor T5, the emission control thin film transistor T6, and the second initialization thin film transistor T7 may include a silicon semiconductor. Also, each of the compensation thin film transistor T3 and the first initialization thin film transistor T4 may include an oxide semiconductor.

At least one thin film transistor may be arranged along the first semiconductor layer Act1 including a silicon semiconductor. Some areas of the first semiconductor layer Act1 may be the semiconductor areas of the driving thin film transistor T1, the switching thin film transistor T2, the operation control thin film transistor T5, the emission control thin film transistor T6, and the second initialization thin film transistor T7. In other words, the semiconductor areas of the driving thin film transistor T1, the switching thin film transistor T2, the operation control thin film transistor T5, the emission control thin film transistor T6, and the second initialization thin film transistor T7 may be connected to each other and may be bent in various shapes.

The first semiconductor layer Act1 may include a channel area and a source area and a drain area on two sides of the channel area. For example, the source area and the drain area may be doped with dopants, and the dopants may include N-type dopants or P-type dopants. The source area and the drain area may be respectively understood as the source electrode and the drain electrode of the thin film transistor. Hereinafter, for convenience of description, the source electrode and the drain electrode will be respectively described as the source area and the drain area.

The driving thin film transistor T1 may include a driving channel area A1, a driving source area S1 and a driving drain area D1 on two sides of the driving channel area A1, and a driving gate electrode G1 overlapping the driving channel area A1. The driving channel area A1 may have a curved shape such as an omega shape to maintain a long channel length in a narrow space. When the driving channel area A1 is long, the driving range of a gate voltage may widen and thus the gradation of light emitted from a display element may be more finely controlled and the display quality thereof may be improved.

The switching thin film transistor T2 may include a switching channel area A2, a switching source area S2 and a switching drain area D2 on two sides of the switching channel area A2, and a switching gate electrode G2 overlapping the switching channel area A2. The switching drain area D2 may be connected to the driving source area S1.

The operation control thin film transistor T5 may include an operation control channel area A5, an operation control source area S5 and an operation control drain area D5 respectively located on two sides of the operation control channel area A5, and an operation control gate electrode G5 overlapping the operation control channel area A5. The operation control drain area D5 may be connected to the driving source area S1. The operation control drain area D5 may be connected to the switching drain area D2.

The emission control thin film transistor T6 may include an emission control channel area A6, an emission control source area S6 and an emission control drain area D6 located on two sides of the emission control channel area A6, and an emission control gate electrode G6 overlapping the emission control channel area A6. The emission control source area S6 may be connected to the driving drain area D1.

The second initialization thin film transistor T7 may include a second initialization channel area A7, a second initialization source area S7 and a second initialization drain area D7 respectively located on two sides of the second initialization channel area A7, and a second initialization gate electrode G7 overlapping the second initialization channel area A7. The second initialization source area S7 may be connected to the emission control drain area D6.

A first gate conductive layer GL1 may be arranged over or overlap the first semiconductor layer Act1 with at least one intervening insulating layer. The first gate conductive layer GL1 may include a first scan line SL1, an emission control line EL, and a driving gate electrode G1.

The first scan line SL1 may extend in the first direction (e.g., the x direction or the −x direction). Some areas of the first scan line SL1 may be the switching gate electrode G2, the second initialization gate electrode G7, and a third electrode CE3 of the boost capacitor Cbt. For example, an area of the first scan line SL1 overlapping the switching channel area A2 may be the switching gate electrode G2. Also, an area of the first scan line SL1 overlapping the second initialization channel area A7 may be the second initialization gate electrode G7. An area of the first scan line SL1 overlapping the second semiconductor layer Act2 may be the third electrode CE3.

The emission control line EL may extend in the first direction (e.g., the x direction or the −x direction). Some areas of the emission control line EL may be the operation control gate electrode G5 and the emission control gate electrode G6. For example, an area of the emission control line EL overlapping the operation control channel area A5 may correspond to the operation control gate electrode G5. Also, an area of the emission control line EL overlapping the emission control channel area A6 may correspond to the emission control gate electrode G6.

The driving gate electrode G1 may be connected to the compensation thin film transistor T3 through a second conductive pattern CDP2.

In an embodiment, the first scan line SL1, the emission control line EL, and the driving gate electrode G1 may be arranged directly on the same insulating layer and may include the same material.

The second gate conductive layer GL2 may be arranged over or overlap at least one insulating layer covering the first gate conductive layer GL1. The second gate conductive layer GL2 may include an initialization voltage line VL, a lower previous scan line SLpa, a second lower scan line SL2a, and a second electrode CE2.

In an embodiment, the initialization voltage line VL may extend in the first direction (e.g., the x direction or the −x direction). The initialization voltage line VL may be connected to the first initialization thin film transistor T4 and the second initialization thin film transistor T7 through a fifth conductive pattern CDP5. The initialization voltage line VL may have a constant voltage (e.g., −2 V).

In an embodiment, the lower previous scan line SLpa may extend in the first direction (e.g., the x direction or the −x direction). One area of the lower previous scan line SLpa may be a first initialization lower gate electrode G4a.

In an embodiment, the second lower scan line SL2a may extend in the first direction (e.g., the x direction or the −x direction). One area of the second lower scan line SL2a may be a lower compensation gate electrode G3a.

The second electrode CE2 may overlap the driving gate electrode G1 and may constitute a storage capacitor Cst together with the driving gate electrode G1. The storage capacitor Cst may include a first electrode CE1 and a second electrode CE2, and the first electrode CE1 may be the driving gate electrode G1. That is, the first electrode CE1 may be integrally formed with the driving gate electrode G1. In this case, the storage capacitor Cst may overlap the driving thin film transistor T1. The second electrode CE2 may include an opening CEOP having a closed curve shape or perimeter. The opening CEOP may expose a center portion of the first electrode CE1.

The initialization voltage line VL, the lower previous scan line SLpa, the second lower scan line SL2a, and the second electrode CE2 may be arranged directly on the same insulating layer and may include the same material.

The second semiconductor layer Act2 may be arranged over or overlap at least one insulating layer covering the second gate conductive layer GL2. At least one thin film transistor may be arranged along the second semiconductor layer Act2 including an oxide semiconductor. Some areas of the second semiconductor layer Act2 may be semiconductor areas of the compensation thin film transistor T3 and the first initialization thin film transistor T4. In other words, the semiconductor areas of the compensation thin film transistor T3 and the first initialization thin film transistor T4 may be connected to each other.

The second semiconductor layer Act2 may include a channel area and a source area and a drain area on two sides of the channel area. For example, the source area and the drain area may have increased carrier concentrations resulted from a plasma treatment. The source area and the drain area be a source electrode and a drain electrode, respectively. Hereinafter, the terms "source area" and "drain area" will be used instead of the source electrode and the drain electrode.

The compensation thin film transistor T3 may include a compensation channel area A3, a compensation source area S3 and a compensation drain area D3 on two sides of the compensation channel area A3, and a compensation gate electrode G3 overlapping the compensation channel area A3. The compensation source area S3 may be electrically connected to the driving gate electrode G1 through a second conductive pattern CDP2. The compensation source area S3 may be connected to a fourth electrode CE4 of the boost capacitor Cbt. In an embodiment, the compensation source area S3 may be integrally provided with the fourth electrode CE4 of the boost capacitor Cbt. In other words, the boost capacitor Cbt may include a third electrode CE3 and a fourth electrode CE4. The boost capacitor Cbt may increase the voltage of a second conductive pattern CDP2 when the first scan signal Sn' supplied to the first scan line SL1 is turned off. As such, when the voltage of the second conductive pattern CDP2 is increased, the black gradation may be clearly expressed. The compensation drain area D3 may be electrically connected to the emission control source area S6 through a fourth conductive pattern CDP4.

The first initialization thin film transistor T4 may include a first initialization channel area A4, a first initialization source area S4 and a first initialization drain area D4 on two sides of the first initialization channel area A4, and a first initialization gate electrode G4 overlapping the first initialization channel area A4. The first initialization drain area D4 may be connected to the compensation source area S3. The first initialization source area S4 may be connected to a fifth conductive pattern CDP5. Thus, the first initialization source area S4 may be electrically connected to the initialization voltage line VL.

A third gate conductive layer GL3 may be arranged over or overlap the second semiconductor layer Act2 with at least one intervening insulating layer. The third gate conductive layer GL3 may include an upper previous scan line SLpb and a second upper scan line SL2b.

The upper previous scan line SLpb may extend in the first direction (e.g., the x direction or the −x direction). The upper previous scan line SLpb may constitute a previous scan line SLp together with the lower previous scan line SLpa. In other words, the previous scan line SLp may include a lower previous scan line SLpa and an upper previous scan line SLpb. In some embodiments, one of the lower previous scan line SLpa and the upper previous scan line SLpb may be optional.

One area of the upper previous scan line SLpb may be a first initialization upper gate electrode G4b. The first initialization upper gate electrode G4b may constitute a first initialization gate electrode G4 together with the first initialization lower gate electrode G4a. In other words, the first initialization gate electrode G4 may include a first initialization lower gate electrode G4a and a first initialization upper gate electrode G4b. In this case, the first initialization thin film transistor T4 may have a dual-gate structure. In some embodiments, one of the first initialized lower gate electrode G4a and the first initialized upper gate electrode G4b may be optional. In this case, the first initialization thin film transistor T4 may have a single-gate structure.

The second upper scan line SL2b may extend in the first direction (e.g., the x direction or the −x direction). The second upper scan line SL2b may constitute a second scan line SL2 together with the second lower scan line SL2a. In other words, the second scan line SL2 may include a second lower scan line SL2a and a second upper scan line SL2b. In some embodiments, one of the second lower scan line SL2a and the second upper scan line SL2b may be optional.

One area of the second upper scan line SL2b may be an upper compensation gate electrode G3b. The upper compensation gate electrode G3b may constitute a compensation gate electrode G3 together with the lower compensation gate electrode G3a. In other words, the compensation gate electrode G3 may include a lower compensation gate electrode G3a and an upper compensation gate electrode G3b. In this case, the compensation thin film transistor T3 may have a dual-gate structure. In some embodiments, at least one of the lower compensation gate electrode G3a and the upper compensation gate electrode G3b may be optional. In this case, the compensation thin film transistor T3 may have a single-gate structure.

A plurality of inorganic insulating patterns IPT may be arranged over or overlap the third gate conductive layer GL3, and a plurality of conductive patterns CDP may be arranged over or overlap the plurality of inorganic insulating patterns IPT.

The plurality of inorganic insulating patterns IPT may be arranged in the subpixel area PXA. In other words, the plurality of inorganic insulating patterns IPT may overlap the subpixel area PXA. That is, the plurality of inorganic insulating patterns IPT may overlap one subpixel area PXA. The plurality of inorganic insulating patterns IPT may be spaced apart from each other. In an embodiment, the plurality of inorganic insulating patterns IPT may be spaced apart from each other in the subpixel area PXA.

A first line may overlap one of the plurality of inorganic insulating patterns IPT, and a second line may overlap another one of the plurality of inorganic insulating patterns IPT. The first line and the second line may overlap the subpixel area PXA, may extend parallel to each other, and may extend in the first direction (e.g., the x direction or the −x direction). For example, the first line may be at least one of the first scan line SL1, the second scan line SL2, the previous scan line SLp, and the initialization voltage line VL, and the second line may be the emission control line EL.

The plurality of conductive patterns CDP may be respectively arranged over or overlap the plurality of inorganic insulating patterns IPT. In an embodiment, the plurality of conductive patterns CDP may be arranged over one of the plurality of inorganic insulating patterns IPT. In other words, the plurality of conductive patterns CDP may be arranged over or overlap one inorganic insulating pattern IPT. In other embodiments, the plurality of conductive patterns CDP may be respectively arranged over or overlap the plurality of inorganic insulating patterns IPT.

In an embodiment, the plurality of conductive patterns CDP may include a first conductive pattern CDP1, a second conductive pattern CDP2, a third conductive pattern CDP3, a fourth conductive pattern CDP4, a fifth conductive pattern CDP5, and a sixth conductive pattern CDP6. In an embodiment, the first conductive pattern CDP1, the second conductive pattern CDP2, the fourth conductive pattern CDP4, and the fifth conductive pattern CDP5 may be arranged over or overlap one of the plurality of inorganic insulating patterns IPT. The third conductive pattern CDP3 may be arranged over or overlap another one of the plurality of inorganic insulating patterns IPT. The sixth conductive pattern CDP6 may be arranged over or overlap still another one of the plurality of inorganic insulating patterns IPT.

The first conductive pattern CDP1 may electrically connect the switching source area S2 to the data line DL. The second conductive pattern CDP2 may electrically connect the driving gate electrode G1 to the compensation source area S3. In an embodiment, the second conductive pattern CDP2 may electrically connect the driving gate electrode G1 to the compensation source area S3 through the opening CEOP of the second electrode CE2. The third conductive pattern CDP3 may electrically connect the driving voltage line PL to the operation control source area S5. The third conductive pattern CDP3 may electrically connect the driving voltage line PL to the second electrode CE2. The fourth conductive pattern CDP4 may electrically connect the compensation drain area D3 to the emission control source area S6. The fifth conductive pattern CDP5 may electrically connect the first initialization source area S4 to the initialization voltage line VL. The fifth conductive pattern CDP5 may electrically connect the second initialization drain area D7 to the initialization voltage line VL. The sixth conductive pattern CDP6 may electrically connect the emission control drain area D6 to an upper conductive pattern UCDP.

In an embodiment, the plurality of conductive patterns CDP may be arranged directly on the same insulating layer and may include the same material.

The upper conductive layer UCDL may be arranged over or overlap at least one insulating layer covering the plurality of conductive patterns CDP and the plurality of inorganic insulating patterns IPT. The upper conductive layer UCDL may include a driving voltage line PL, a data line DL, and an upper conductive pattern UCDP. In an embodiment, at least one of the driving voltage line PL and the data line DL may be a third line overlapping the subpixel area PXA and extending in the second direction (e.g., the y direction or the -y direction).

The driving voltage line PL may extend in the second direction (e.g., the y direction or the -y direction) intersecting with the first direction (e.g., the x direction or the -x direction). In an embodiment, the driving voltage line PL may extend substantially in the second direction (e.g., the y direction or the -y direction). The driving voltage line PL may be electrically connected to the second electrode CE2 and the operation control source area S5 through the third conductive pattern CDP3.

The data line DL may extend in the second direction (e.g., the y direction or the -y direction). The data line DL may be electrically connected to the switching source area S2 through the first conductive pattern CDP1. A portion of the data line DL may be the switching source electrode.

The upper conductive pattern UCDP may be electrically connected to the sixth conductive pattern CDP6. Although not illustrated, the upper conductive pattern UCDP may be electrically connected to an organic light emitting diode as a display element.

In an embodiment, the driving voltage line PL, the data line DL, and the upper conductive pattern UCDP may be arranged directly on the same insulating layer and may include the same material.

The pixel circuit layer PCL may include a plurality of inorganic insulating patterns IPT spaced apart from each other, may include a first line and a second line extending in the first direction (e.g., the x direction or the -x direction), and may include a third line extending in the second direction (e.g., the y direction or the -y direction). In other words, the display apparatus 1 may include the plurality of inorganic insulating patterns IPT and simultaneously the lines may be variously arranged in the first direction (e.g., the x direction or the -x direction) and/or the second direction (e.g., the y direction or the -y direction) without disconnection. Thus, because the display apparatus 1 according to an embodiment includes the plurality of inorganic insulating patterns IPT spaced apart from each other, defects potentially caused by an external impact may be prevented or reduced and the lines may be variously arranged in the pixel circuit layer PCL.

Figure 11:
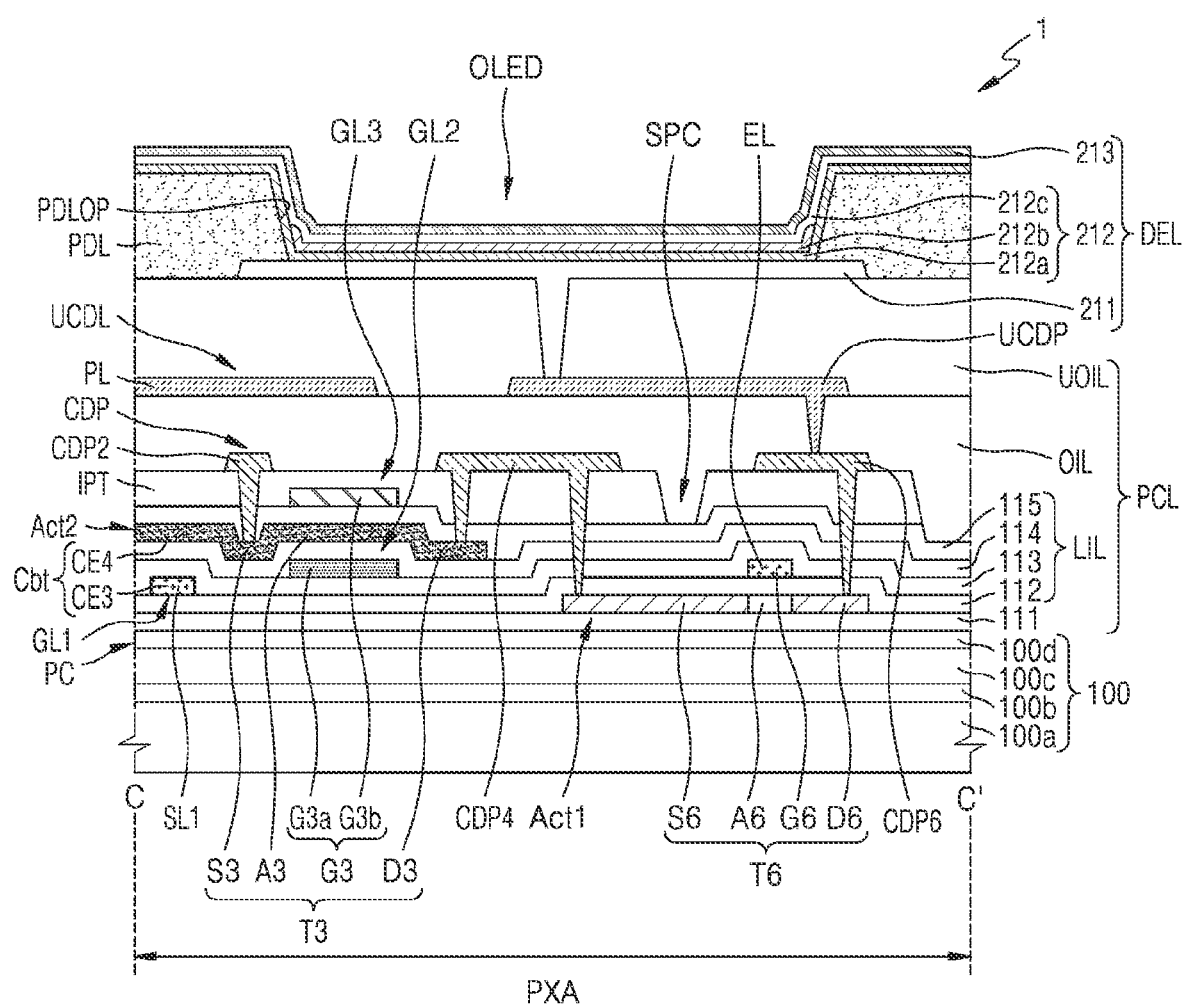
FIG. 11 is a cross-sectional view schematically illustrating the display apparatus of FIG. 9 taken along line C-C' according to an embodiment.

FIG. 11 is a cross-sectional view schematically illustrating the display apparatus 1 of FIG. 9 taken along line C-C' according to an embodiment. In FIG. 11, like reference numerals as those in FIGS. 7 and 9 will denote like members, and thus redundant descriptions thereof will be omitted for conciseness.

Referring to FIG. 11, the display apparatus 1 may include a substrate 100, a pixel circuit layer PCL, and a display element layer DEL. The pixel circuit layer PCL may define a pixel circuit PC. In other words, the pixel circuit layer PCL may include a pixel circuit PC. The display element layer DEL may include an organic light emitting diode OLED as a display element.

The substrate 100 may include a subpixel area PXA. In an embodiment, the substrate 100 may include a plurality of subpixel areas PXA. In an embodiment, one pixel circuit PC may be arranged in the subpixel area PXA. In an embodiment, one organic light emitting diode OLED may be arranged in the subpixel area PXA.

The pixel circuit layer PCL defining the pixel circuit PC may be arranged over the substrate 100. The pixel circuit PC may overlap the subpixel area PXA. The pixel circuit layer PCL may include a buffer layer 111, a first semiconductor layer Act1, a lower inorganic insulating layer LIL, a first gate conductive layer GL1, a second gate conductive layer GL2, a second semiconductor layer Act2, a third gate conductive layer GL3, a plurality of inorganic insulating patterns IPT, a plurality of conductive patterns CDP, an organic insulating layer OIL, an upper conductive layer UCDL, and an upper organic insulating layer UOIL.

The first semiconductor layer Act1 may be arranged over or overlap the buffer layer 111. The first semiconductor layer Act1 may include a silicon semiconductor. In an embodiment, the first semiconductor layer Act1 may include the emission control source area S6, the emission control channel area A6, and the emission control drain area D6 of the emission control thin film transistor T6.

The lower inorganic insulating layer LIL may be arranged over or overlap the substrate 100. In an embodiment, the lower inorganic insulating layer LIL may be arranged between the substrate 100 and the plurality of inorganic insulating patterns IPT. In an embodiment, the lower inorganic insulating layer LIL may be continuously arranged over the substrate 100. In an embodiment, the lower inorganic insulating layer LIL may include a groove. The lower inorganic insulating layer LIL may include a first gate insulating layer 112, a second gate insulating layer 113, a lower insulating layer 114, and a third gate insulating layer 115 that are sequentially arranged over the substrate 100. In other words, the first semiconductor layer Act1 may be arranged between the substrate 100 and the first gate insulating layer 112.

The first gate conductive layer GL1 may be arranged over or overlap the first gate insulating layer 112. In an embodiment, the first gate conductive layer GL1 may be arranged between the first gate insulating layer 112 and the second gate insulating layer 113. In an embodiment, the first gate conductive layer GL1 may include a first scan line SL1 and an emission control line EL. The first scan line SL1 may extend in the first direction (e.g., the x direction or the −x direction in FIG. 9). The emission control line EL may extend in the first direction (e.g., the x direction or the −x direction in FIG. 9). The emission control line EL may overlap the emission control channel area A6. The emission control line EL overlapping the emission control channel area A6 may be the emission control gate electrode G6. The second gate insulating layer 113 may cover the first gate conductive layer GL1.

The first scan line SL1 configured to transmit a first scan signal may be a first line and may overlap one of the plurality of inorganic insulating patterns IPT, and the emission control line EL configured to transmit an emission control signal may be a second line and may overlap another one of the plurality of inorganic insulating patterns IPT.

The second gate conductive layer GL2 may be arranged over or overlap the second gate insulating layer 113. In an embodiment, the second gate conductive layer GL2 may include a lower compensation gate electrode G3a.

The lower insulating layer 114 may cover the second gate conductive layer GL2. In other words, the second gate conductive layer GL2 may be arranged between the second gate insulating layer 113 and the lower insulating layer 114. The lower insulating layer 114 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$, which may be ZnO and/or $ZnO_2$).

The second semiconductor layer Act2 may be arranged over or overlap the lower insulating layer 114. The second semiconductor layer Act2 may include an oxide semiconductor. In an embodiment, the second semiconductor layer Act2 may include a compensation channel area A3, a compensation source area S3, and a compensation drain area D3.

In an embodiment, one area of the first scan line SL1 may be the third electrode CE3, and one area of the second semiconductor layer Act2 may be the fourth electrode CE4. The third electrode CE3 and the fourth electrode CE4 may constitute the boost capacitor Cbt.

The third gate insulating layer 115 may cover the second semiconductor layer Act2. In other words, the second semiconductor layer Act2 may be arranged between the lower insulating layer 114 and the third gate insulating layer 115.

The third gate insulating layer 115 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$, which may be ZnO and/or $ZnO_2$).

The third gate conductive layer GL3 may be arranged over or overlap the third gate insulating layer 115. In an embodiment, the third gate conductive layer GL3 may include an upper compensation gate electrode G3b. The upper compensation gate electrode G3b may constitute a compensation gate electrode G3 together with the lower compensation gate electrode G3a. In other words, the compensation gate electrode G3 may include a lower compensation gate electrode G3a and an upper compensation gate electrode G3b. In this case, the compensation thin film transistor T3 may have a dual-gate structure. In some embodiments, at least one of the lower compensation gate electrode G3a and the upper compensation gate electrode G3b may be optional. In this case, the compensation thin film transistor T3 may have a single-gate structure.

The plurality of inorganic insulating patterns IPT may be arranged in the subpixel area PXA. In other words, the plurality of inorganic insulating patterns IPT may overlap the subpixel area PXA. That is, the plurality of inorganic insulating patterns IPT may overlap one subpixel area PXA.

The plurality of inorganic insulating patterns IPT may be arranged over the lower inorganic insulating layer LIL. In an embodiment, the plurality of inorganic insulating patterns IPT may be arranged over or overlap the third gate insulating layer 115 and/or the lower insulating layer 114. In other words, the third gate conductive layer GL3 may be arranged between the third gate insulating layer 115 and the plurality of inorganic insulating patterns IPT.

The plurality of inorganic insulating patterns IPT may be spaced apart from each other in a direction parallel to the substrate 100. The plurality of inorganic insulating patterns IPT may be formed of a same material. In an embodiment, the plurality of inorganic insulating patterns IPT may be spaced apart from each other in the subpixel area PXA. A space SPC may be defined between the plurality of inorganic insulating patterns IPT adjacent to each other. The space SPC may be arranged in the subpixel area PXA and may overlap the organic light emitting diode OLED as a display element. In some embodiments, when the lower inorganic insulating layer LIL includes a groove, the groove may overlap the space SPC between the plurality of inorganic insulating patterns IPT adjacent to each other.

The plurality of conductive patterns CDP may be arranged over or overlap the plurality of inorganic insulating patterns IPT. In an embodiment, the plurality of conductive patterns CDP may include a second conductive pattern CDP2, a fourth conductive pattern CDP4, and a sixth conductive pattern CDP6.

In an embodiment, the plurality of conductive patterns CDP may be arranged over one of the plurality of inorganic insulating patterns IPT. For example, the second conductive pattern CDP2 and the fourth conductive pattern CDP4 may be arranged over or overlap one of the plurality of inorganic insulating patterns IPT. The sixth conductive pattern CDP6 may be arranged over another one of the plurality of inorganic insulating patterns IPT. In other embodiments, the plurality of conductive patterns CDP may be respectively arranged over the plurality of inorganic insulating patterns IPT.

The second conductive pattern CDP2 may be electrically connected to the compensation source area S3 of the second semiconductor layer Act2 through a contact hole of the third gate insulating layer 115 and the inorganic insulating pattern IPT. The fourth conductive pattern CDP4 may be electrically connected to the compensation drain area D3 of the second semiconductor layer Act2 through a contact hole of the third gate insulating layer 115 and the inorganic insulating pattern IPT. The fourth conductive pattern CDP4 may be electrically connected to the emission control source area S6 of the first semiconductor layer Act1 through a contact hole of the first gate insulating layer 112, the second gate insulating layer 113, the lower insulating layer 114, the third gate insulating layer 115, and the inorganic insulating pattern IPT. The sixth conductive pattern CDP6 may be electrically connected to the emission control drain area D6 of the first semiconductor layer Act1 through a contact hole of the first gate insulating layer 112, the second gate insulating layer 113, the lower insulating layer 114, the third gate insulating layer 115, and the inorganic insulating pattern IPT.

The organic insulating layer OIL may cover the plurality of inorganic insulating patterns IPT. The organic insulating layer OIL may fill the space SPC defined between the plurality of inorganic insulating patterns IPT adjacent to each other. A portion of the organic insulating layer OIL may be arranged inside the space SPC. The organic insulating layer OIL may cover the plurality of conductive patterns CDP. In an embodiment, the plurality of conductive patterns CDP may be arranged between the plurality of inorganic insulating patterns IPT and the organic insulating layer OIL.

The upper conductive layer UCDL may be arranged over or overlap the organic insulating layer OIL. The upper conductive layer UCDL may include a driving voltage line PL and an upper conductive pattern UCDP. The upper conductive pattern UCDP may be electrically connected to the sixth conductive pattern CDP6 through a contact hole of the organic insulating layer OIL.

The upper organic insulating layer UOIL may cover the upper conductive layer UCDL.

The display element layer DEL may be arranged over or overlap the pixel circuit layer PCL. The display element layer DEL may include an organic light emitting diode OLED as a display element electrically connected to the pixel circuit PC. The organic light emitting diode OLED may include a pixel electrode 211, an intermediate layer 212, and an opposite electrode 213. The pixel electrode 211 may be electrically connected to the upper conductive pattern UCDP through a contact hole of the upper organic insulating layer UOIL.

Figure 12:
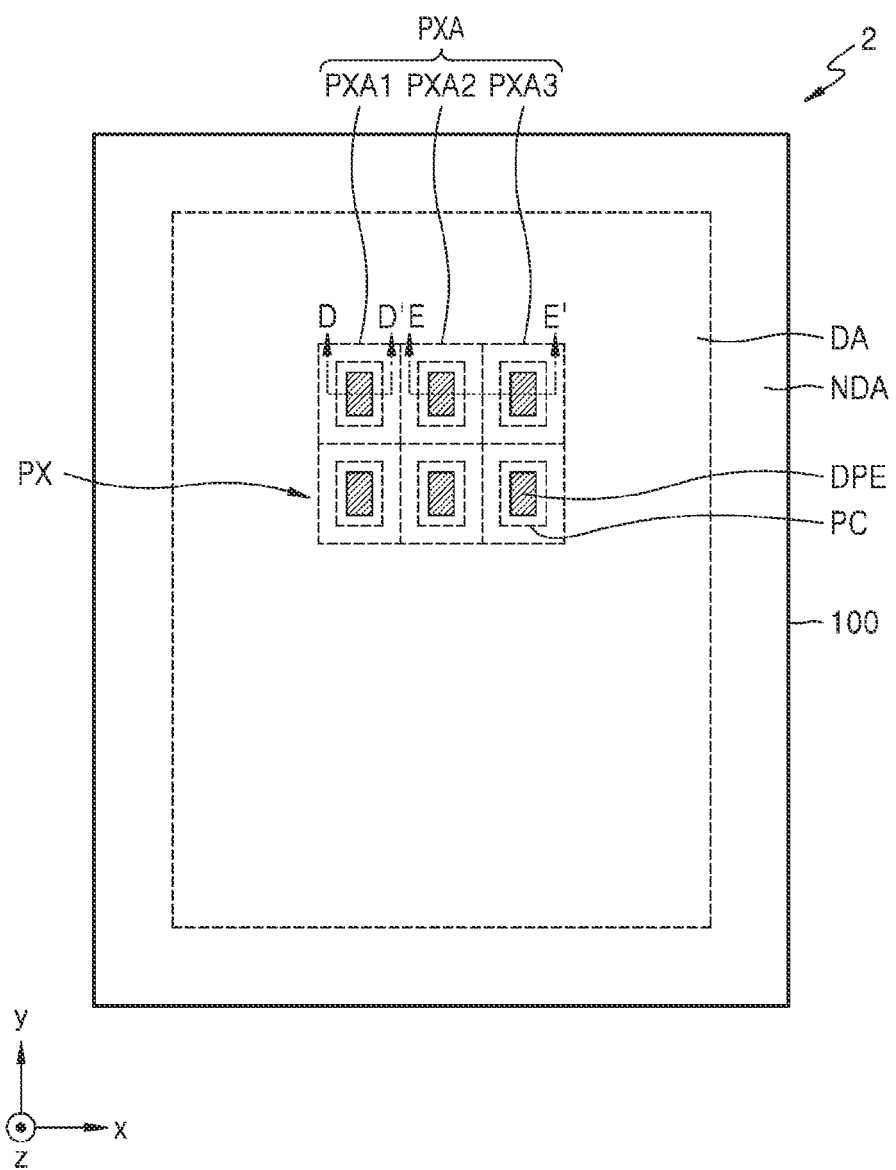
FIG. 12 is a plan view schematically illustrating a display apparatus according to an embodiment.

FIG. 12 is a plan view schematically illustrating a display apparatus 2 according to an embodiment. In FIG. 12, like reference numerals as those in FIG. 1 will denote like members, and thus redundant descriptions thereof will be omitted for conciseness.

Referring to FIG. 12, the display apparatus 2 may include a substrate 100, a pixel circuit PC, and a display element DPE. The substrate 100 may include a display area DA and a non-display area NDA.

The display area DA may include a subpixel area PXA. In an embodiment, the display area DA may include a plurality of subpixel areas PXA. The plurality of subpixel areas PXA may be arranged in a first direction (e.g., the x direction or the −x direction) and a second direction (e.g., the y direction or the −y direction) intersecting with the first direction. In an embodiment, the subpixel area PXA may include a first subpixel area PXA1, a second subpixel area PXA2, and a third subpixel area PXA3.

The pixel circuit PC may transmit an electrical signal to the display element DPE and may control the display element DPE. In an embodiment, the pixel circuit PC may be arranged in or on the subpixel area PXA. In an embodiment, a plurality of pixel circuits PC may be respectively arranged in or on a plurality of subpixel areas PXA. For example, the plurality of pixel circuits PC may be respectively arranged in the first subpixel area PXA1, the second subpixel area PXA2, and the third subpixel area PXA3. In this case, the subpixel area PXA may be defined as an area in which the pixel circuit PC is arranged.

The display element DPE may emit light and may be arranged in the subpixel area PXA. In an embodiment, a plurality of display elements DPE may be respectively arranged in or on a plurality of subpixel areas PXA. For example, the plurality of display elements DPE may be respectively arranged in the first subpixel area PXA1, the second subpixel area PXA2, and the third subpixel area PXA3. That is, the subpixel area PXA may be defined as an area in which the display element DPE is arranged.

Figure 13:
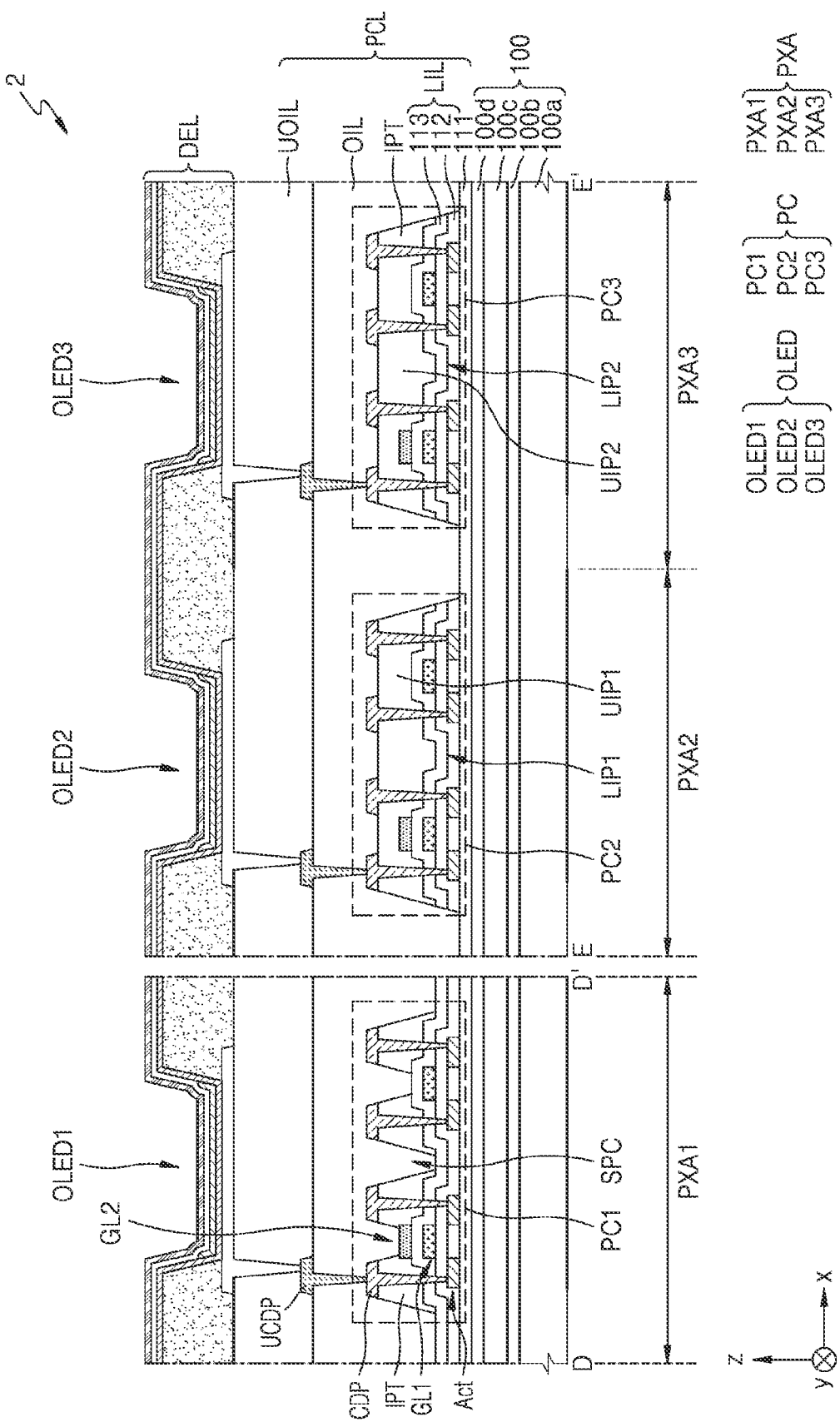
FIG. 13 is a cross-sectional view illustrating the display apparatus of FIG. 12 taken along lines D-D' and E-E' according to an embodiment.

FIG. 13 is a cross-sectional view illustrating the display apparatus 2 of FIG. 12 taken along lines D-D' and E-E' according to an embodiment.

Referring to FIG. 13, the display apparatus 2 may include a substrate 100, a pixel circuit layer PCL, and a display element layer DEL. The pixel circuit layer PCL may define a pixel circuit PC. In other words, the pixel circuit layer PCL may include a pixel circuit PC. The display element layer DEL may include an organic light emitting diode OLED as a display element.

The substrate 100 may include a subpixel area PXA. In an embodiment, the substrate 100 may include a plurality of subpixel areas PXA. The subpixel area PXA may include a first subpixel area PXA1, a second subpixel area PXA2, and a third subpixel area PXA3.

The pixel circuit layer PCL defining the pixel circuit PC may be arranged over or overlap the substrate 100. The pixel circuit PC may overlap the subpixel area PXA. In an embodiment, one pixel circuit PC may be arranged in or on the subpixel area PXA. For example, a first pixel circuit PC1 may be arranged in or on the first subpixel area PXA1. A second pixel circuit PC2 may be arranged in or on the second subpixel area PXA2. A third pixel circuit PC3 may be arranged in or on the third subpixel area PXA3. The organic light emitting diode OLED may include a first organic light emitting diode OLED1 arranged in or on the first subpixel area PXA1, a second organic light emitting diode OLED2 arranged in or on the second subpixel area PXA2, and a third organic light emitting diode OLED3 arranged in or on the third subpixel area PXA3.

The pixel circuit layer PCL may include a buffer layer 111, a semiconductor layer Act, a lower inorganic insulating layer LIL, a first gate conductive layer GL1, a second gate conductive layer GL2, a plurality of inorganic insulating patterns IPT (including a first inorganic insulating pattern and a second inorganic insulating pattern), a plurality of conductive patterns CDP, a first upper inorganic insulating pattern UIP1 (or third inorganic insulating pattern), a second upper inorganic insulating pattern UIP2 (or fourth inorganic insulating pattern), an organic insulating layer OIL, an upper conductive pattern UCDP, and an upper organic insulating layer UOIL.

The buffer layer 111 may be continuously arranged in or on the first subpixel area PXA1. In an embodiment, a first portion of the buffer layer 111 overlapping the second subpixel area PXA2 and a second portion of the buffer layer 111 overlapping the third subpixel area PXA3 may be spaced apart from each other. In other embodiments, the buffer layer 111 may be continuously arranged in or on the second subpixel area PXA2 and the third subpixel area PXA3.

The lower inorganic insulating layer LIL may be arranged over or overlap the substrate 100. In an embodiment, the lower inorganic insulating layer LIL may be continuously arranged in or on the first subpixel area PXA1. In an embodiment, the lower inorganic insulating layer LIL may include a groove in the first subpixel area PXA1. The lower inorganic insulating layer LIL may include a first gate insulating layer 112 and a second gate insulating layer 113 that are sequentially arranged over the substrate 100.

The lower inorganic insulating layer LIL may include a first lower inorganic insulating pattern LIP1 and a second lower inorganic insulating pattern LIP2. The first lower inorganic insulating pattern LIP1 may overlap the second subpixel area PXA2. The second lower inorganic insulating pattern LIP2 may overlap the third subpixel area PXA3. Also, the first lower inorganic insulating pattern LIP1 and the second lower inorganic insulating pattern LIP2 may be spaced apart from each other in a plan view, e.g., in the plan view defined by the first direction (e.g., the x direction or the −x direction) and the second direction (e.g., the y direction or the −y direction).

The plurality of inorganic insulating patterns IPT may be arranged in or on the first subpixel area PXA1. In other words, the plurality of inorganic insulating patterns IPT may overlap the first subpixel area PXA1. That is, the plurality of inorganic insulating patterns IPT may overlap one first subpixel area PXA1.

The plurality of inorganic insulating patterns IPT may be arranged over or overlap the lower inorganic insulating layer LIL. In an embodiment, the plurality of inorganic insulating patterns IPT may be arranged over or overlap the second gate insulating layer 113 and/or the first gate insulating layer 112.

The plurality of inorganic insulating patterns IPT may be spaced apart from each other. In an embodiment, the plurality of inorganic insulating patterns IPT may be spaced apart from each other in or on the first subpixel area PXA1. A space SPC may be defined between the plurality of inorganic insulating patterns IPT adjacent to each other. The space SPC may be arranged in the first subpixel area PXA1 and may overlap the organic light emitting diode OLED as a display element. In some embodiments, when the lower inorganic insulating layer LIL includes a groove in or on the first subpixel area PXA1, the groove may overlap the space SPC between the plurality of inorganic insulating patterns IPT adjacent to each other.

The first upper inorganic insulating pattern UIP1 may be arranged over or overlap the first lower inorganic insulating pattern LIP1. The first upper inorganic insulating pattern UIP1 may be arranged in or on the second subpixel area PXA2. The second upper inorganic insulating pattern UIP2 may be arranged over or overlap the second lower inorganic insulating pattern LIP2. The second upper inorganic insulating pattern UIP2 may be arranged in or on the third subpixel area PXA3. The first upper inorganic insulating pattern UIP1 and the second upper inorganic insulating pattern UIP2 may be spaced apart from each other in a plan view, e.g., in the plan view defined by the first direction (e.g., the x direction or the −x direction) and the second direction (e.g., the y direction or the −y direction). The first upper inorganic insulating pattern UIP1 and the second upper inorganic pattern UIP2 may be formed of the material(s) of the inorganic insulating patterns IPT.

In an embodiment, the edge of the first lower inorganic insulating pattern LIP1 and the edge of the first upper inorganic insulating pattern UIP1 may match. Lateral faces/edges of the first lower inorganic insulating pattern LIP1 may be respectively coplanar with and/or connected to lateral faces of the first upper inorganic insulating pattern UIP1. In other embodiments, the edge of the first lower inorganic insulating pattern LIP1 and the edge of the first upper inorganic insulating pattern UIP1 may not match and may have a step therebetween. Lateral faces/edges of the first lower inorganic insulating pattern LIP1 may be respectively spaced from lateral faces of the first upper inorganic insulating pattern UIP1, such that one or more additional steps may be formed on the second subpixel area PXA2.

In an embodiment, the edge of the second lower inorganic insulating pattern LIP2 and the edge of the second upper inorganic insulating pattern UIP2 may match. Lateral faces/edges of the second lower inorganic insulating pattern LIP2 may be respectively coplanar with and/or connected to lateral faces/edges of the second upper inorganic insulating pattern UIP2. In other embodiments, the edge of the second lower inorganic insulating pattern LIP2 and the edge of the second upper inorganic insulating pattern UIP2 may not match and may have a step therebetween. Lateral faces/edges of the second lower inorganic insulating pattern LIP2 may be respectively spaced from lateral faces/edges of the second upper inorganic insulating pattern UIP2, such that one or more additional steps may be formed on the third subpixel area PXA3.

The plurality of conductive patterns CDP may be arranged over or overlap the plurality of inorganic insulating patterns IPT, the first upper inorganic insulating pattern UIP1, and the second upper inorganic insulating pattern UIP2. In an embodiment, in or on the first subpixel area PXA1, the plurality of conductive patterns CDP may be respectively arranged over the plurality of inorganic insulating patterns IPT. In other embodiments, in or on the first subpixel area PXA1, the plurality of conductive patterns CDP may be arranged over or overlap one of the plurality of inorganic insulating patterns IPT.

In or on the second subpixel area PXA2, the plurality of conductive patterns CDP may be arranged over one first upper inorganic insulating pattern UIP1. In or on the second subpixel area PXA2, the plurality of conductive patterns CDP may overlap the same first upper inorganic insulating pattern UIP1. In or on the third subpixel area PXA3, the plurality of conductive patterns CDP may be arranged over one second upper inorganic insulating pattern UIP2. In or on the third subpixel area PXA3, the plurality of conductive patterns CDP may overlap the same second upper inorganic insulating pattern UIP2.

The organic insulating layer OIL may cover the plurality of inorganic insulating patterns IPT, the first upper inorganic insulating pattern UIP1, and the second upper inorganic insulating pattern UIP2. The organic insulating layer OIL may cover the plurality of conductive patterns CDP.

The organic insulating layer OIL may fill the space SPC defined between the plurality of inorganic insulating patterns IPT adjacent to each other. The organic insulating layer OIL may fill the space between the first lower inorganic insulating pattern LIP1 and the second lower inorganic insulating pattern LIP2. The organic insulating layer OIL may fill the space between the first upper inorganic insulating pattern UIP1 and the second upper inorganic insulating pattern UIP2.

In or on the second subpixel area PXA2, a signal line and/or a voltage line configured to transmit a signal to the second pixel circuit PC2 may be arranged between the organic insulating layer OIL and the upper organic insulating layer UOIL. In or on the third subpixel area PXA3, a signal line and/or a voltage line configured to transmit a signal to the third pixel circuit PC3 may be arranged between the organic insulating layer OIL and the upper organic insulating layer UOIL. In an embodiment, the signal lines may include a scan line configured to transmit a scan signal and/or a data line configured to transmit a data signal. In an embodiment, the voltage lines may include a driving voltage line.

The plurality of inorganic insulating patterns IPT may be spaced apart from each other in or on the first subpixel area PXA1, and the space SPC between the plurality of inorganic insulating patterns IPT adjacent to each other may overlap the organic light emitting diode OLED as a display element. Thus, even when the display apparatus 2 includes the plurality of inorganic insulating patterns IPT, it may be unnecessary to increase the area of the first subpixel area PXA1 not overlapping the display element. Also, the space between the first lower inorganic insulating pattern LIP1 and the second lower inorganic insulating pattern LIP2 and the space between the first upper inorganic insulating pattern UIP1 and the second upper inorganic insulating pattern UIP2 may be filled. Thus, the display apparatus 2 may have desirably high flexibility at the second subpixel area PXA2 and the third subpixel area PXA3 and may have desirably high rigidity at the first subpixel area PXA1. That is, the display apparatus 2 may have suitable rigidity and suitable flexibility.

As described above, the display apparatus according to an embodiment may include a plurality of inorganic insulating patterns overlapping a subpixel area and spaced apart from each other in a direction parallel to the subpixel area and an organic insulating layer covering the plurality of inorganic insulating patterns. Advantageously, the display apparatus may display high resolution images and may prevent or reduce defects in the event of an external impact.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate including a subpixel area;
    a pixel circuit layer arranged over the substrate and defining a pixel circuit overlapping the subpixel area; and
    a display element layer arranged over the pixel circuit layer and including a display element electrically connected to the pixel circuit,
    wherein the pixel circuit layer includes:
    a lower inorganic insulating layer arranged over the substrate;
    a first semiconductor layer;
    a plurality of inorganic insulating patterns overlapping the subpixel area, arranged over the lower inorganic insulating layer and the first semiconductor layer, and spaced apart from each other in a plan view such that each of the plurality of inorganic insulating patterns has an isolated shape in the plan view;
    an organic insulating layer covering the plurality of inorganic insulating patterns; and
    a plurality of conductive patterns arranged between the plurality of inorganic insulating patterns and the organic insulating layer,
    wherein the plurality of conductive patterns include a source electrode and a drain electrode each of which extend to the first semiconductor layer,
    wherein the source electrode is arranged on a first inorganic insulating pattern and the drain electrode is arranged on a second inorganic insulating pattern spaced apart from the first inorganic insulating pattern, and
    wherein each of the first and second inorganic insulating patterns are spaced apart from remainder of the plurality of inorganic insulating patterns.

2. The display apparatus of claim 1, wherein a portion of the organic insulating layer is arranged inside a space defined between the plurality of inorganic insulating patterns adjacent to each other.

3. The display apparatus of claim 2, wherein the space overlaps the display element.

4. The display apparatus of claim 1, wherein the pixel circuit layer further includes:
    a first conductive line arranged between one of the plurality of inorganic insulating patterns and the substrate and extending in a first direction; and
    a second conductive line arranged between another one of the plurality of inorganic insulating patterns and the substrate and extending in the first direction.

5. The display apparatus of claim 4, wherein the pixel circuit layer further includes a third conductive line arranged between the organic insulating layer and the display element layer, overlapping the subpixel area, and extending in a second direction intersecting with the first direction.

6. The display apparatus of claim 1, wherein the lower inorganic insulating layer includes a first gate insulating layer and a second gate insulating layer sequentially arranged over the substrate,
    the first semiconductor layer is arranged between the substrate and the first gate insulating layer, and
    the pixel circuit layer further includes a first gate conductive layer arranged between the first gate insulating layer and the second gate insulating layer.

7. The display apparatus of claim 6, wherein each of the plurality of conductive patterns is arranged over corresponding one of the plurality of inorganic insulating patterns.

8. The display apparatus of claim 6, wherein at least two of the plurality of conductive patterns are arranged over one of the plurality of inorganic insulating patterns.

9. The display apparatus of claim 1, wherein the lower inorganic insulating layer includes a first gate insulating layer, a second gate insulating layer, a lower insulating layer, and a third gate insulating layer sequentially arranged over the substrate,
    the first semiconductor layer is arranged between the substrate and the first gate insulating layer and includes a silicon semiconductor, and
    the pixel circuit layer further includes a second semiconductor layer arranged between the lower insulating layer and the third gate insulating layer and including an oxide semiconductor.

10. The display apparatus of claim 1, wherein the subpixel area includes a first subpixel area, a second subpixel area, and a third subpixel area,
    the plurality of inorganic insulating patterns are arranged in the first subpixel area,
    the lower inorganic insulating layer includes a first lower inorganic insulating pattern overlapping the second subpixel area and a second lower inorganic insulating pattern overlapping the third subpixel area and spaced apart from the first lower inorganic insulating pattern in the plan view, and the pixel circuit layer further includes a first upper inorganic insulating pattern arranged over the first lower inorganic insulating pattern and a second upper inorganic insulating pattern arranged over the second lower inorganic insulating pattern and spaced apart from the first upper inorganic insulating pattern in the plan view.

11. A display apparatus comprising:
a substrate including a subpixel area;
a pixel circuit layer arranged over the substrate and defining a pixel circuit overlapping the subpixel area; and
a display element layer arranged over the pixel circuit layer and including a display element electrically connected to the pixel circuit,
wherein the pixel circuit layer includes:
a lower inorganic insulating layer arranged over the substrate;
a first semiconductor layer;
a first conductive line and a second conductive line overlapping the subpixel area and extending in a first direction;
a plurality of inorganic insulating patterns arranged over the first conductive line and the second conductive line and spaced apart from each other in a plan view such that each of the plurality of inorganic insulating patterns has an isolated shape in the plan view;
an organic insulating layer covering the plurality of inorganic insulating patterns;
a third conductive line arranged over the organic insulating layer and extending in a direction intersecting with the first direction, and
a plurality of conductive patterns arranged between the plurality of inorganic insulating patterns and the organic insulating layer,
wherein the plurality of inorganic insulating patterns are arranged over the lower inorganic insulating layer and the first semiconductor layer,
wherein the plurality of conductive patterns include a source electrode and a drain electrode each of which extend to the first semiconductor layer,
wherein the source electrode is arranged on a first inorganic insulating pattern and the drain electrode is arranged on a second inorganic insulating pattern spaced apart from the first inorganic insulating pattern, and wherein each of the first and second inorganic insulating patterns are spaced apart from a remainder of the plurality of inorganic insulating patterns.

12. The display apparatus of claim 11, wherein a portion of the organic insulating layer is arranged inside a space defined between the plurality of inorganic insulating patterns adjacent to each other.

13. The display apparatus of claim 12, wherein the space overlaps the display element.

14. The display apparatus of claim 11, wherein the first conductive line overlaps one of the plurality of inorganic insulating patterns, and
the second conductive line overlaps another one of the plurality of inorganic insulating patterns.

15. The display apparatus of claim 11, wherein the first conductive line is a scan line configured to transmit a scan signal, and wherein
the second conductive line is an emission control line configured to transmit an emission control signal.

16. The display apparatus of claim 11, wherein the lower inorganic insulating layer is arranged between the substrate and the plurality of inorganic insulating patterns and includes a first gate insulating layer and a second gate insulating layer that are sequentially stacked.

17. The display apparatus of claim 16, wherein the first semiconductor layer is arranged between the substrate and the first gate insulating layer;
wherein the pixel circuit layer further includes a first gate conductive layer arranged between the first gate insulating layer and the second gate insulating layer.

18. The display apparatus of claim 17, wherein at least two of the plurality of conductive patterns are arranged over one of the plurality of inorganic insulating patterns.

19. The display apparatus of claim 11, wherein the lower inorganic insulating layer is arranged between the substrate and the plurality of inorganic insulating patterns and includes a first gate insulating layer, a second gate insulating layer, a lower insulating layer, and a third gate insulating layer that are sequentially stacked;
wherein the first semiconductor layer is arranged between the substrate and the first gate insulating layer and includes a silicon semiconductor;
wherein the pixel circuit layer further includes a second semiconductor layer arranged between the lower insulating layer and the third gate insulating layer and including an oxide semiconductor.

20. An electronic apparatus including the display apparatus of claim 1.

* * * * *